United States Patent
Kim et al.

(10) Patent No.: US 10,250,195 B2
(45) Date of Patent: Apr. 2, 2019

(54) RECEIVER RECEIVING WIDEBAND RADIO FREQUENCY SIGNAL, WIRELESS COMMUNICATION DEVICE INCLUDING THE SAME, AND METHOD OF OPERATING THE WIRELESS COMMUNICATION DEVICE

(71) Applicant: SAMSUNG ELECTRONICS CO., LTD., Suwon-si, Gyeonggi-Do (KR)

(72) Inventors: Young-Min Kim, Suwon-si (KR); Jae-Seung Lee, Hwaseong-si (KR); Pil-Sung Jang, Uijeongbu-si (KR); Tae-Hwan Jin, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/804,192

(22) Filed: Nov. 6, 2017

(65) Prior Publication Data
US 2018/0145634 A1   May 24, 2018

(30) Foreign Application Priority Data

Nov. 18, 2016  (KR) .................. 10-2016-0154443
Aug. 2, 2017   (KR) .................. 10-2017-0098072

(51) Int. Cl.
*G06F 3/033* (2013.01)
*H03F 1/02* (2006.01)
*H03F 3/19* (2006.01)
*H03F 3/21* (2006.01)
*H04B 1/16* (2006.01)

(52) U.S. Cl.
CPC ............ *H03F 1/0277* (2013.01); *H03F 3/19* (2013.01); *H03F 3/211* (2013.01); *H04B 1/16* (2013.01); *H03F 2200/222* (2013.01); *H03F 2200/294* (2013.01); *H03F 2200/414* (2013.01); *H03F 2200/421* (2013.01); *H03F 2200/451* (2013.01)

(58) Field of Classification Search
CPC .......... H03F 1/0277; H03F 3/19; H03F 3/211; H04B 1/16
USPC .......................................................... 455/130
See application file for complete search history.

(56) References Cited

U.S. PATENT DOCUMENTS 7,274,257 B2   9/2007  Kim et al.
7,495,514 B2   2/2009  Huang et al.
(Continued)

FOREIGN PATENT DOCUMENTS

CN    105790777     7/2016
KR    10-1055850    8/2011
(Continued)

*Primary Examiner* — Sanh D Phu
(74) *Attorney, Agent, or Firm* — F. Chau & Associates, LLC

(57) ABSTRACT

A wireless communication device includes an amplifier block amplifying a radio frequency (RF) input signal. The amplifier block includes: a first amplification unit and a second amplification unit. The first amplification unit amplifies the RF input signal to generate a first RF amplified signal including a first non-linearity factor and a second RF amplified signal including a second non-linearity factor, and combines the first and second RF signals to generate a third RF amplified signal. The second amplification unit receives and amplifies the third RF amplified signal to output an RF output signal corresponding to the at least one carrier.

24 Claims, 26 Drawing Sheets

(56) References Cited

U.S. PATENT DOCUMENTS

| | | |
|---|---|---|
| 8,063,729 B2 | 11/2011 | Ezzeddine |
| 8,373,509 B2 | 2/2013 | Zeng et al. |
| 8,494,455 B2 | 7/2013 | Chan |
| 9,154,356 B2 | 10/2015 | Tasic et al. |
| 9,160,598 B2 | 10/2015 | Davierwalla et al. |
| 9,178,473 B2 | 11/2015 | Sankaranarayanan |
| 9,379,673 B2 | 6/2016 | Wang et al. |
| 9,407,222 B2 | 8/2016 | Kanemaru |
| 2007/0207752 A1* | 9/2007 | Behzad .................... H04B 1/18 455/132 |
| 2016/0164476 A1* | 6/2016 | Wang ...................... H03F 1/565 330/250 |
| 2016/0204966 A1 | 7/2016 | Kim et al. |

FOREIGN PATENT DOCUMENTS

| | | |
|---|---|---|
| KR | 10-1611175 | 4/2016 |
| KR | 1020160087329 | 7/2016 |

\* cited by examiner

RECEIVER RECEIVING WIDEBAND RADIO FREQUENCY SIGNAL, WIRELESS COMMUNICATION DEVICE INCLUDING THE SAME, AND METHOD OF OPERATING THE WIRELESS COMMUNICATION DEVICE

CROSS-REFERENCE TO RELATED APPLICATIONS

This application claims the benefit of and priority to Korean Patent Application Nos. 10-2016-0154443, filed on Nov. 18, 2016 and 10-2017-0098072, filed on Aug. 2, 2017, in the Korean Intellectual Property Office, the disclosures of which are incorporated by reference in their entireties herein.

BACKGROUND

1. Technical Field

The inventive concept relates to a wireless communication device supporting carrier aggregation, and more particularly, to a receiver receiving a wideband radio frequency (RF) signal and a wireless communication device including the receiver.

2. Discussion of Related Art

A wireless communication device may modulate an RF signal after placing data on a predetermined carrier, amplify the modulated RF signal, and transmit the amplified RF signal to a wireless communication network. Also, the wireless communication device may receive an RF signal from the wireless communication network, and amplify and demodulate the RF signal. In order to transmit/receive more data, the wireless communication device may support carrier aggregation (CA), that is, transmission/reception of RF signals modulated by performing multi-carrier modulation (MCM). However, the wireless communication device may not be able to effectively support CA if it is unable to prevent degradation in noise features or gain features.

SUMMARY

At least one embodiment of the inventive concept provides a receiver capable of improving a gain feature of a wireless communication device supporting carrier aggregation (CA), and a wireless communication device including the receiver.

According to an exemplary of the inventive concept, there is provided a wireless communication device including: an amplifier block configured to receive a radio frequency (RF) input signal transmitted using at least one carrier and amplify the RF input signal to generate at least one RF output signal. The amplifier block includes: a first amplification unit configured to amplify the RF input signal to generate a first RF amplified signal including a first non-linearity factor and a second RF amplified signal including a second non-linearity factor, and combine the first and second RF amplified signals to generate a third RF amplified signal; and a second amplification unit configured to receive the third RF amplified signal and amplify the third RF amplified signal to generate an RF output signal corresponding to the at least one carrier.

According to an exemplary embodiment of the inventive concept, there is provided a receiver for receiving and processing an RF input signal based on a carrier aggregation (CA) mode. The receiver includes a plurality of amplifier blocks. Each of the plurality of amplifier blocks includes a first amplification unit and a second amplification unit. The first amplification unit includes at least two input amplifiers having different properties from each other so that non-linearity factors generated when amplifying the RF input signal have different signs from each other. The first amplification unit is configured to perform a first cancellation of the non-linearity factors and amplify the RF input signal into an RF amplified signal by using the at least two input amplifiers. The second amplification unit includes a plurality of amplification circuits each including at least one amplifier configured to receive and amplify the RF amplified signal to output an RF output signal corresponding to a predetermined carrier.

According to an exemplary embodiment of the inventive concept, there is provided a method of operating a wireless communication device supporting carrier aggregation. The method including: amplifying a radio frequency (RF) input signal that is generated from an RF signal transmitted by using at least one carrier into a first RF amplified signal including a first non-linearity factor and a second RF amplified signal including a second non-linearity factor having a different sign from a sign of the first non-linearity factor; generating a third RF amplified signal by adding the first RF amplified signal and the second RF amplified signal; generating an RF output signal corresponding to the at least one carrier by amplifying the third RF amplified signal; and generating a baseband signal by down-converting the RF output signal.

According to an exemplary embodiment of the inventive concept, a wireless communication device is provided that includes first, second, and third amplifiers. The first amplifier includes a first complimentary transistor having a first width. The first amplifier is configured to amplify an input radio frequency (RF) signal transmitted using at least one carrier to generate a first amplified RF signal. The second amplifier includes a non-complimentary transistor having a second width different from the first width. The second amplifier is configured to amplify the input RF signal to generate a second amplified RF signal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
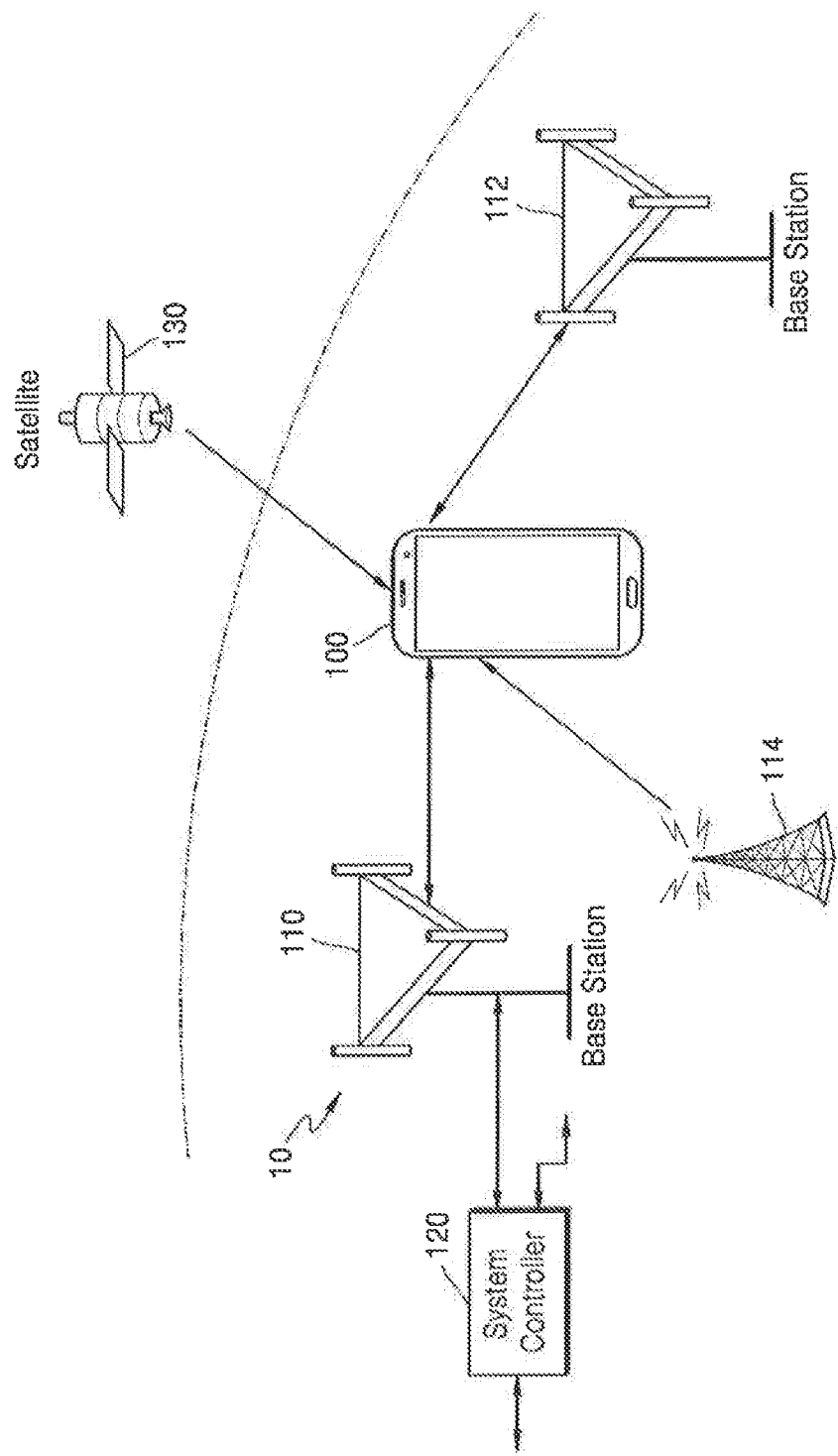
FIG. 1 is a diagram of a wireless communication device and a wireless communication system including the wireless communication device according to an exemplary embodiment of the inventive concept.

FIG. 1 is a diagram of a wireless communication device 100 performing wireless communication operations and a wireless communication system 10 including the wireless communication device 100.

Referring to FIG. 1, the wireless communication system 10 may be one of a long term evolution (LTE) system, a code division multiple (CDMA) system, a global system for mobile communication (GSM) system, and a wireless local area network (WLAN) system. The CDMA system may have various implementations such as a wideband CDMA (WCDMA), a time-division synchronized CDMA (TD-SCDMA), cdma2000, etc.

The wireless communication system 10 includes at least two base stations 110 and 112, and a system controller 120. However, the inventive concept is not limited thereto. For example, the wireless communication system 10 may include more than two base stations and a plurality of network entities. The wireless communication device 100 may be referred to as user equipment (UE), a mobile station (MS), a mobile terminal (MT), a user terminal (UT), a subscribe station (SS), a portable device, etc. The base stations 110 and 112 may denote fixed stations that communicate with the wireless communication device 100 and/or other base stations to transmit and receive data signals and/or control information. The base stations 110 and 112 may be respectively referred to as a node B, an evolved-Node B (eNB), a base transceiver system (BTS), an access point (AP), etc.

The wireless communication device 100 may communicate with the wireless communication system 10, and may receive signals from a broadcast station 114. Moreover, the wireless communication device 100 may receive signals from a satellite 130 of a global navigation satellite system (GNSS) or a global positioning system (GPS). The wireless communication device 100 may support radio technology for wireless communication (for example, LTE, cdma2000, WCDMA, TD-SCDMA, GSM, 802.11, etc.).

In an embodiment, the wireless communication device 100 supports carrier aggregation for performing transmission/reception operations using a plurality of carrier waves. The wireless communication device 100 may perform wireless communication with the wireless communication system 10 in a low band, a mid band, and a high band. The low band, the mid band, and the high band may be respectively referred to as a band group, and each band group may include a plurality of frequency bands. The carrier aggregation (hereinafter, referred to as CA) may be classified as intra-band CA and inter-band CA. The intra-band CA denotes performing of a wireless communication operation by using a plurality of carriers within a frequency band, and the inter-band CA denotes performing of a wireless communication operation by using a plurality of carriers in different frequency bands.

The wireless communication device 100 according to an embodiment of the present inventive concept may perform both intra-band CA and inter-band CA, and moreover, may perform the wireless communication operation by using one carrier, not the CA (i.e., not multiple carriers). An input impedance of a receiver included in the wireless communication device 100 for receiving a radio frequency (RF) signal from the wireless communication system 10 may be constantly maintained during operations of intra-band CA and operations of inter-band CA. In an embodiment, the wireless communication device 100 receives the RF signal, and then, amplifies the RF signal, and at the same time, offsets non-linearity factors to improve gain features. Accordingly, a signal receiving sensitivity of the wireless communication device 100 may be improved, thereby improving reliability in wireless communication operations of the wireless communication device 100.

FIGS. 2A to 2F are diagrams of techniques with respect to CA.

Figure 2A:
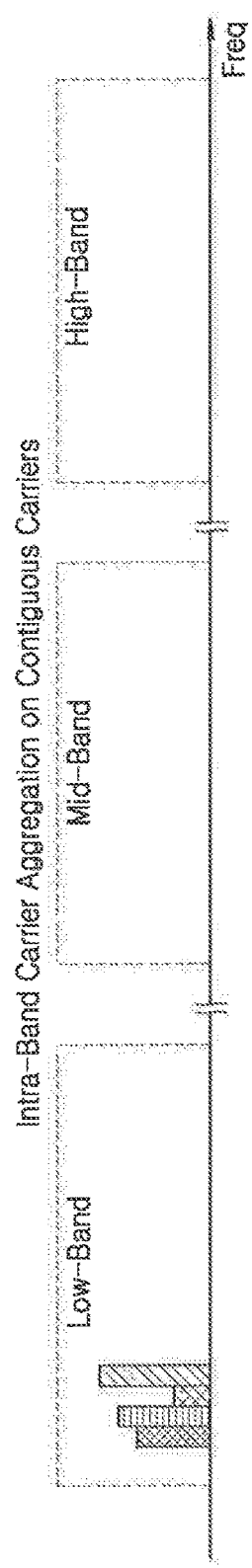
FIGS. 2A, 2B, 2C, 2D, 2E, and 2F are diagrams illustrating a carrier aggregation (CA) technique according to an exemplary embodiment of the inventive concept.

FIG. 2A is a diagram showing contiguous intra-band CA. Referring to FIG. 2A, the wireless communication device 100 of FIG. 1 performs transmission/reception of the signal by using four contiguous carriers within the same frequency band of the low-band. In an embodiment, a group of carriers is considered contiguous when there is no space between any two carriers of the group.

Figure 2B:
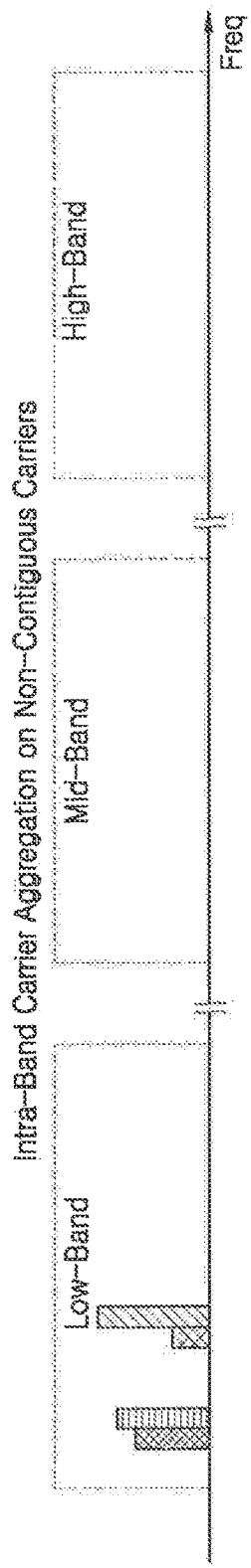

FIG. 2B is a diagram exemplarily showing non-contiguous intra-band CA. Referring to FIG. 2B, the wireless communication device 100 performs transmission/reception of signals by using four non-contiguous carriers in the same frequency band of the low band. In an embodiment, a group of carriers is considered non-contiguous when there is space between at least two of the carriers. The carriers may be respectively spaced apart, for example, 5 MHz, 10 MHz, or another amount, from one another.

Figure 2C:
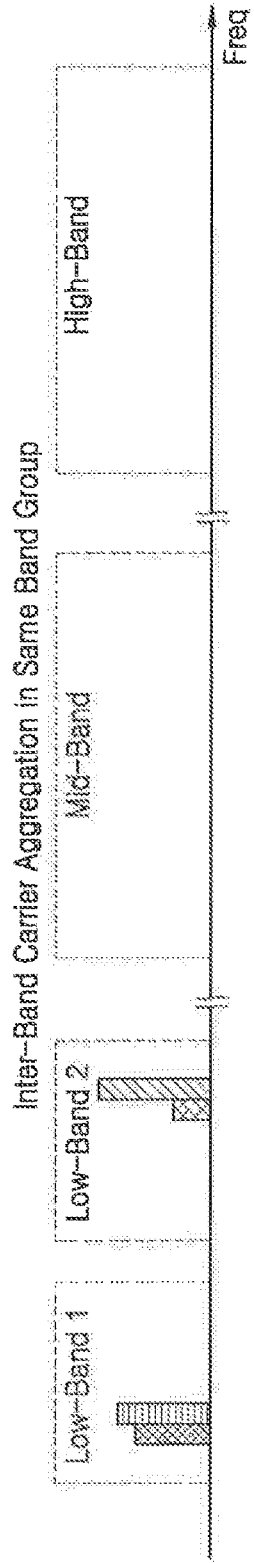

FIG. 2C is a diagram exemplarily showing inter-band CA in the same band group. Referring to FIG. 2C, the wireless communication device 100 performs transmission/reception of the signals by using four carriers in two frequency bands that are included in the same band group.

Figure 2D:
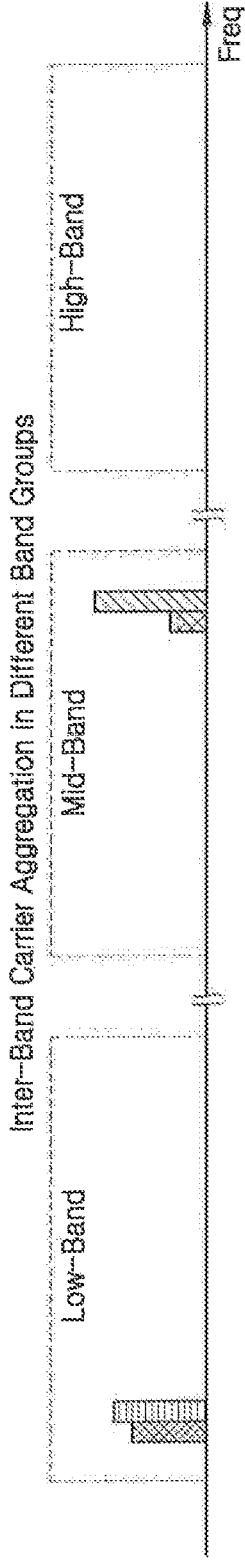

FIG. 2D is a diagram exemplarily showing inter-band CA in different band groups. Referring to FIG. 2D, the wireless communication device 100 performs transmission/reception of the signals by using four carriers included in different band groups. In detail, two carrier waves are in a frequency band included in the low band, and the other two carrier waves are in a frequency band included in the mid band.

Please note that the inventive concept is not limited to the exemplary CAs illustrated in FIGS. 2A to 2D. For example, the wireless communication device 100 may support various combinations of CAs with respect to the frequency bands or the band groups.

Figure 2E:
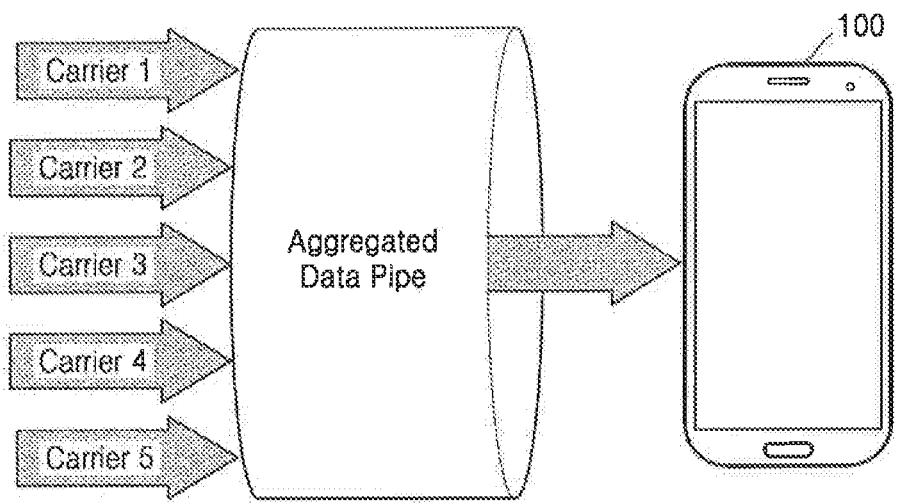

Referring to FIG. 2E, a CA technique is presented, which operates by combining a plurality of frequency bands in one or more base stations in order to meet the requirements about increased bit rates. An LTE network that is one of the mobile networks may realize data transmission speed of 100 Mbps, and thus, may be able to transmit/receive a video of large capacity in a wireless communication environment. FIG. 2E shows an example, in which five frequency bands of LTE standard are combined according to the carrier aggregation technique, which is capable of increasing data transmission speed by five times. In FIG. 2E, each of carriers (carrier 1 to carrier 5) is defined in the LTE, and one frequency bandwidth is defined to be a 20 MHz maximum in the LTE standard. Thus, the wireless communication device 100 according to the embodiment may improve data rates to a bandwidth of 100 MHz.

Figure 2F:
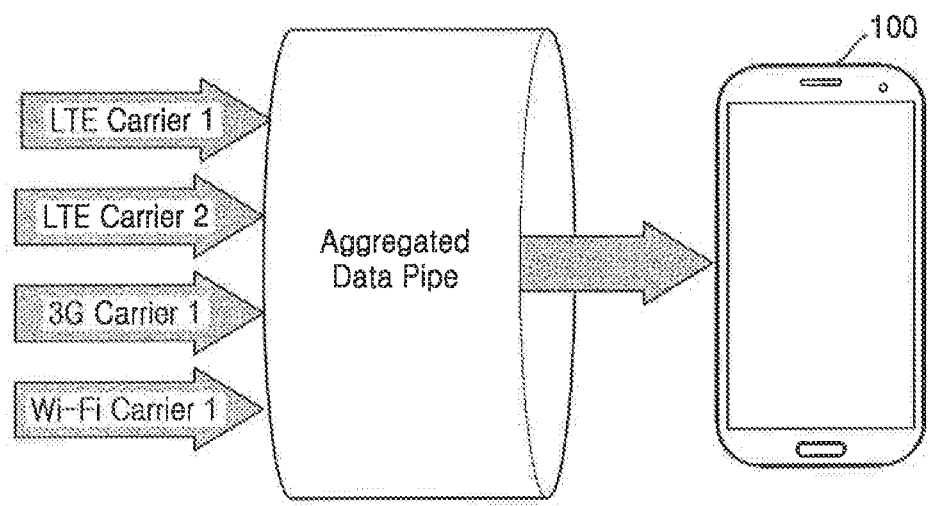

FIG. 2E shows an example in which the carriers defined by the LTE are only combined, but the present inventive concept is not limited thereto. As shown in FIG. 2F, carriers of different wireless communication networks may be combined. Referring to FIG. 2F, when the frequency bands are combined according to the carrier aggregation technique, frequency bands of 3rd-generation (3G) and wireless fidelity (Wi-fi) standards may also be combined. As described above, LTE-A employs the carrier aggregation technique, and thus, data transmission at a faster speed may be performed.

Figure 3:
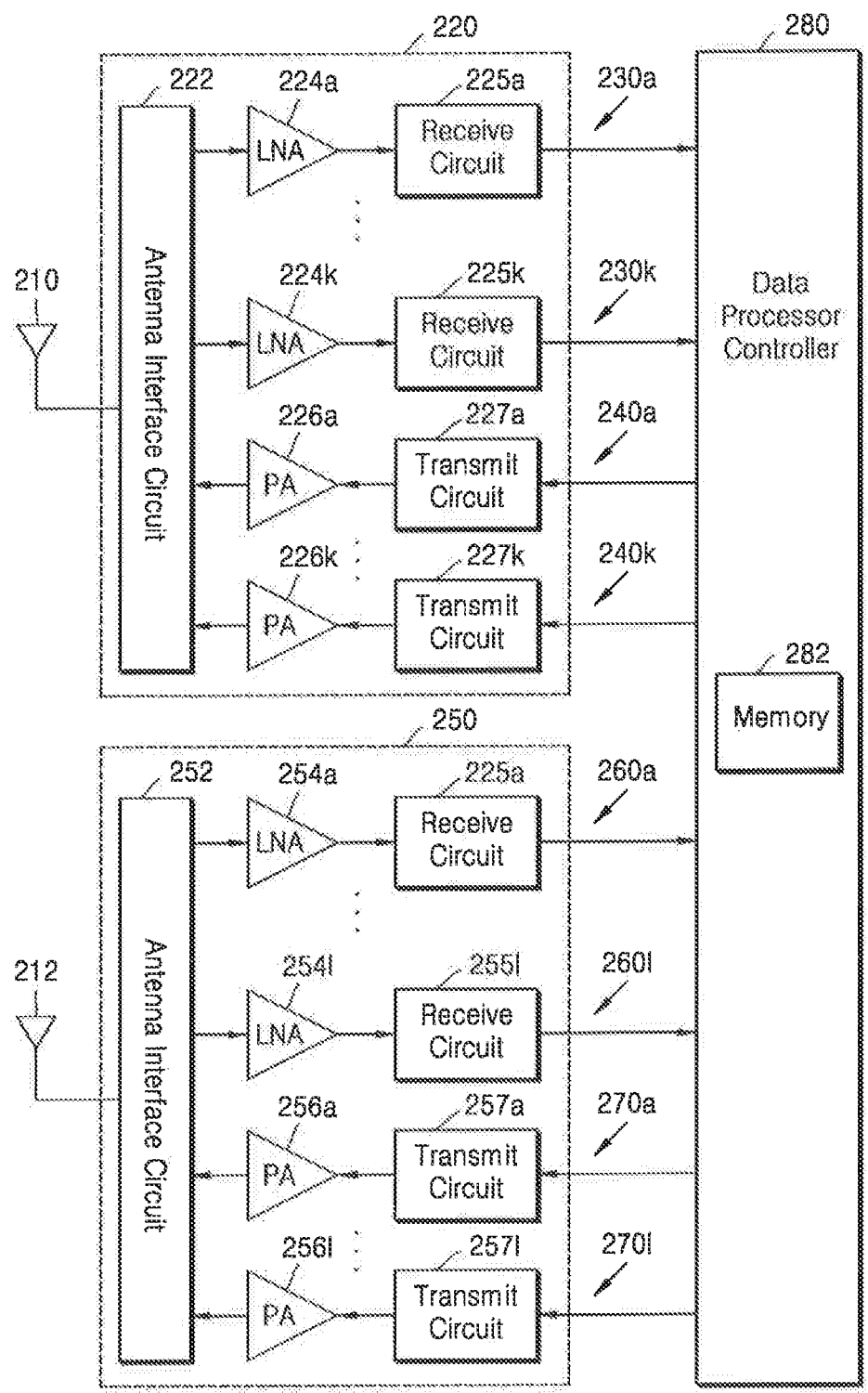
FIG. 3 is a block diagram of an example of the wireless communication device of FIG. 1.

FIG. 3 is a block diagram of another example of the wireless communication device 100 of FIG. 1.

Referring to FIG. 3, a wireless communication device 200 includes a transceiver 220 connected to a primary antenna 210, a transceiver 250 connected to a secondary antenna 212, and a data processor (or controller) 280. The transceiver 220 may include a plurality of receivers 230a to 230k and a plurality of transmitters 240a to 240k. The transceiver 250 may include a plurality of receivers 260a to 260l and a plurality of transmitters 270a to 270l. The transceivers 220 and 250 having the above structure may support a plurality of frequency bands, a plurality of radio techniques, CA, receiving diversity, and multiple-input multiple-out (MIMO) among a plurality of transmitting antennas and a plurality of receiving antennas.

In an embodiment, the first receiver 230a includes a low noise amplifier (LNA) 224a and a receive circuit 225a. A structure of the first receiver 230a may be applied to the other receivers 230b to 230k, and 260a to 260l. Hereinafter, the structure of the first receiver 230a will be described below. For receiving data, the primary antenna 210 may receive an RF signal from a base station and/or a transmitter station. In an embodiment, the primary antenna 210 generates an RF input signal by performing frequency filtering on the received RF signal, and routes the filtered RF input signal to a selected receiver via the antenna interface circuit 222. The antenna interface circuit 222 may include switch devices, a duplexer, a filter circuit, and an input matching circuit. The LNA 224a amplifies the filtered RF input signal to generate an RF output signal, and provides the RF output signal to the data processor 280. The data processor 280 may store data in memory 282 based on the RF output signal.

The LNA 224a according to an embodiment of the present inventive concept maintains an input impedance constantly at a target impedance during communication operations according to various CA. In addition, when the RF input signal is amplified, non-linearity factors that may occur during the amplification may be offset to improve the gain features and noise features during the amplification. In an embodiment, the LNA 224a amplifies the RF input signal sequentially at least twice in order to generate one RF output signal, and may sequentially offset the non-linearity factors generated during the amplification at least twice. Detailed descriptions thereof will be provided later.

In an embodiment, the receive circuit 225a down-converts the RF output signal received from the LNA 224a from RF to a base band to generate a baseband signal. The receive circuit 225a may be referred to as an output circuit in other embodiments. In an embodiment, the receive circuit 225a amplifies and filters the baseband signal, and provides the amplified and filtered baseband signal to the data processor 280. The data processor 280 may store data in memory 282 based on the amplified and filtered baseband signal. The receive circuit 225a may include at least of mixers, filters, amplifiers, an oscillator, a local oscillator generator, a Phase Locked Loop (PLL) circuit, etc.

In an embodiment, the first transmitter 240a includes a power amplifier 226a and a transmit circuit 227a. The structure of the first transmitter 240a may be applied to the other transmitters 240b to 240k, and 270a to 270l. Hereinafter, the structure of the first transmitter 240a will be described below. For transmitting data, the data processor 280 may process data to be transmitted (e.g., data encoding and data modulation), and may provide an analog output signal to a selected transmitter. For example, the data processor 280 may process digital data into analog data for storage in memory 282.

In an embodiment, a transmit circuit 257a up-converts the analog output signal from the base band to RF, and amplifies and filters the analog output signal to generate a modulated RF signal. In an embodiment, the up-convert of the analog output signal results in a modulated RF signal with a higher frequency than the analog output signal. The transmission circuit 257a may include at least one of amplifiers, filters, mixers, input matching circuits, an oscillator, an LO oscillator, a PLL loop circuit, etc. In an embodiment, the power amplifier 226a receives and amplifies the modulated RF signal, and provides a transmission RF signal having an appropriate output power level to the primary antenna 210 via the antenna interface circuit 222. The modulated RF signal may be transmitted to the base station via the primary antenna 210.

All or one of the transceivers 220 and 250 may be implemented as analog integrated circuits, RF integrated circuits, or mixed-signal integrated circuits. For example, the LNAs 224a to 224k and 254a to 254l, and the receive circuits 225a to 225k and 255a to 255l may be implemented as one module (e.g., an RF integrated circuit). However, the inventive concept is not limited thereto. For example, circuit configuration of the transceivers 220 and 250 may be implemented in various different manners.

Figure 4:
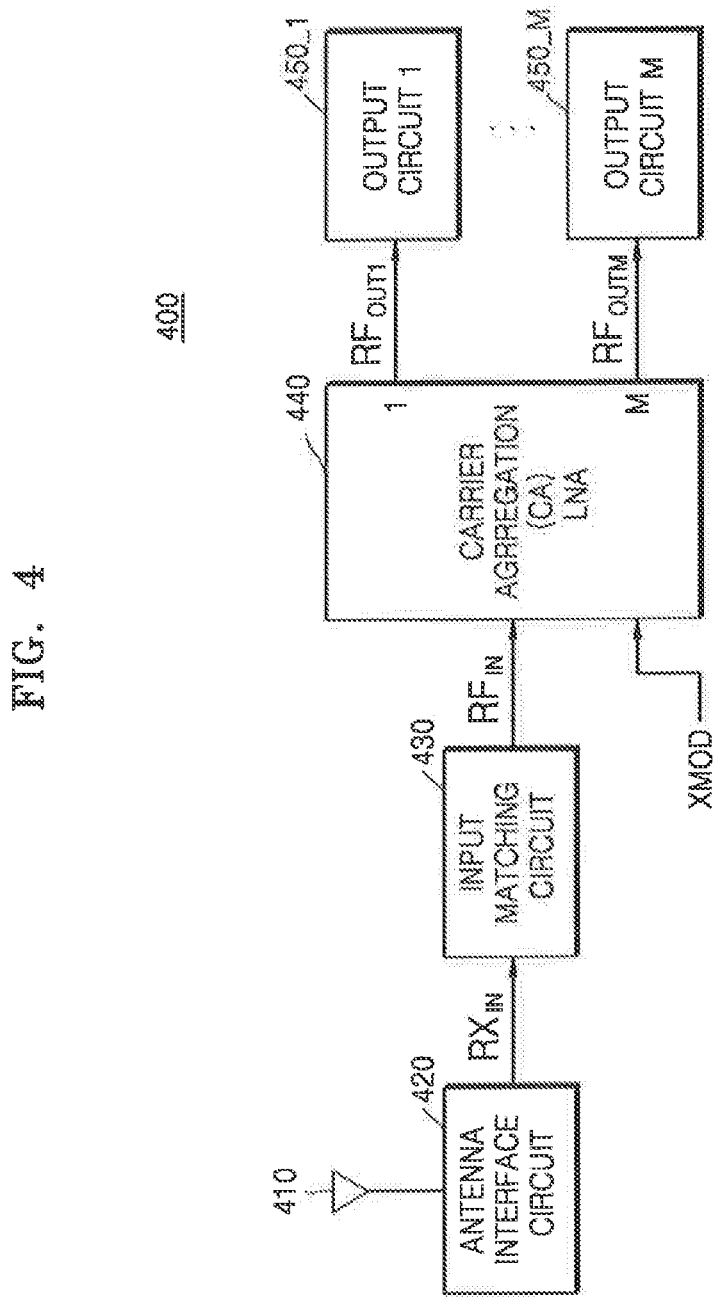
FIG. 4 is a block diagram of a receiver according to an exemplary embodiment of the present inventive concept.

FIG. 4 is a block diagram of a receiver 400 according to an exemplary embodiment of the present inventive concept. The receiver 400 may be used to implement one or more of receivers 230a to 230k and/or receivers 260a to 260l to FIG. 3.

Referring to FIG. 4, the receiver 400 includes a CA LNA 440 supporting non-CA and intra-band CA, an antenna 410, an antenna interface circuit 420, an input matching circuit 430, and a plurality of output circuits 450_1 to 450_M. The CA LNA 440 may operate on outputs of at least one of the LNAs 224a to 224k and 254a to 254l of FIG. 3. The CA LNA 440 may include a single input end and multiple (M) output ends. For example, the CA LNA 440 may receive an input RF signal from the single input end and output multiple RF signals through the multiple output ends based on the input RF signal. The receiver 400 may receive the input RF signal (or a down-link signal) transmitted from at least one carrier via the antenna 410. The antenna 410 may provide the received RF signal to the antenna interface circuit 420. In an embodiment, the antenna interface circuit 420 performs a frequency filtering and a routing of the received RF signal to provide a receiver input signal $RX_{IN}$ to the input matching circuit 430. The input matching circuit 430 may provide an RF input signal $RF_{IN}$ to the CA LNA 440 through an impedance matching. The input matching circuit 430 may perform the impedance matching between the CA LNA 440 and the antenna interface circuit 420 or the antenna 410. The input matching circuit 430 may be included in the antenna interface circuit 420.

The CA LNA 440 amplifies the RF input signal $RF_{IN}$ in CA using one carrier or in non-CA to output one RF output signal through one LNA output end, or amplifies an RF input signal $RF_{IN}$ in the intra-band CA including M carriers to output M RF output signals $RF_{OUT1}$ to $RF_{OUTM}$ through M LNA output ends, where M is greater than 1. In an embodiment, the CA LNA 440 receives a mode control signal XMOD from an outside source, and operates in one of a single output mode or a multiple output mode based on a value or level of the mode control signal XMOD. In the single output mode, the CA LNA 440 operates in a configuration of one input and one output, and receives the RF input signal $RF_{IN}$ including at least one signal transmitted through one carrier. The single output mode may be used to receive the signal transmitted through one carrier without using CA. In the multiple output mode, the CA LNA 440 operates in a configuration of one input and M outputs, and receives the RF input signal $RF_{IN}$ including signals transmitted through a plurality of carriers and outputs M RF output signals $RF_{OUT1}$ to $RF_{OUTM}$ respectively to M output circuits 450_1 to 450_M. One RF output signal may correspond to one carrier. In an embodiment, at least one of the output circuits 450_1 to 450_M receives the RF output signal and down-converts the RF output signal to output the RF output signal as a baseband signal. In an embodiment, the down convert converts the RF output signal to a lower frequency signal. The output circuits 450_1 to 450_M may correspond to the receive circuits 225 and 255 of FIG. 3.

Figure 5A:
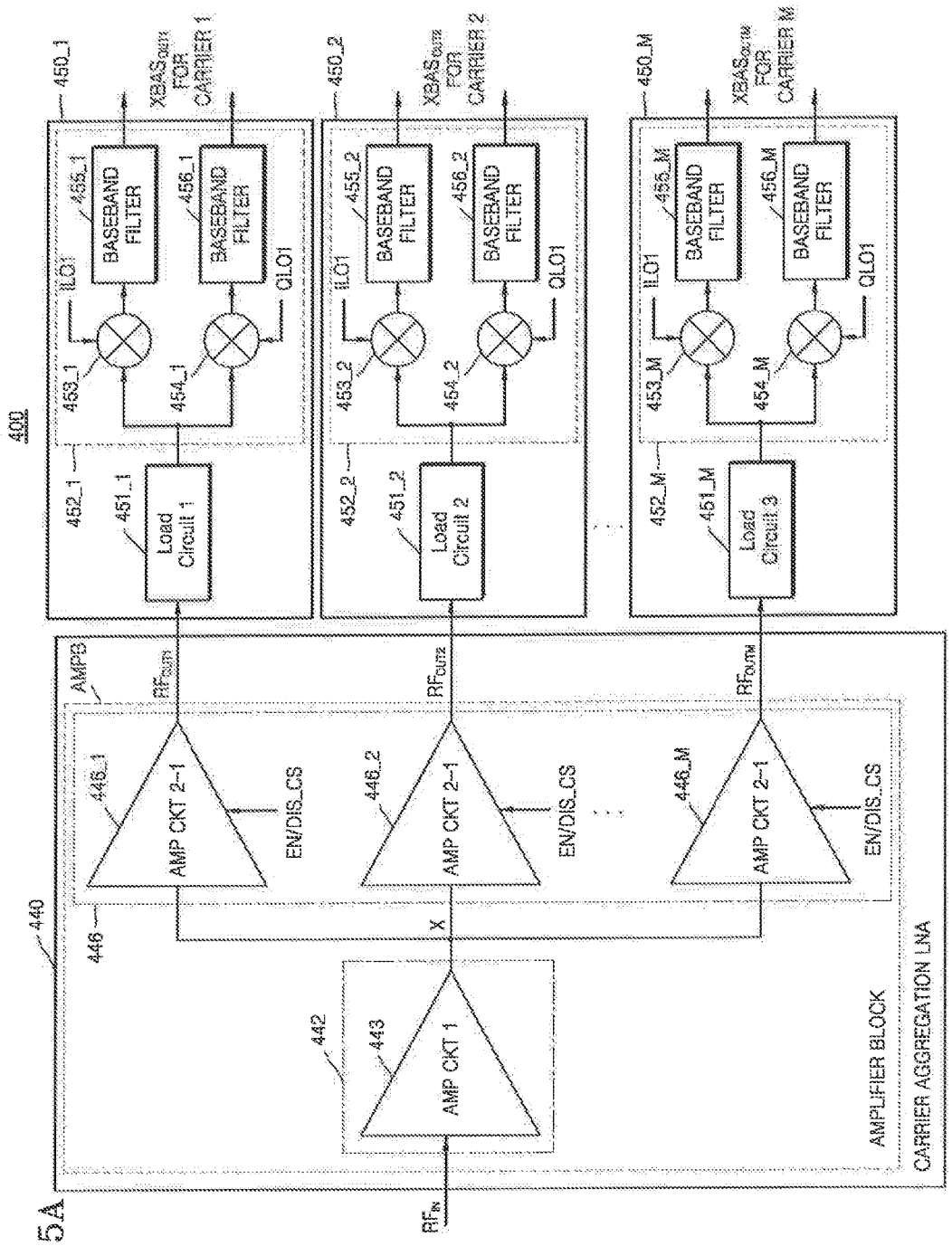
FIGS. 5A and 5B are block diagrams of the receiver of FIG. 4 according to an exemplary embodiment of the inventive concept.
Figure 5B:
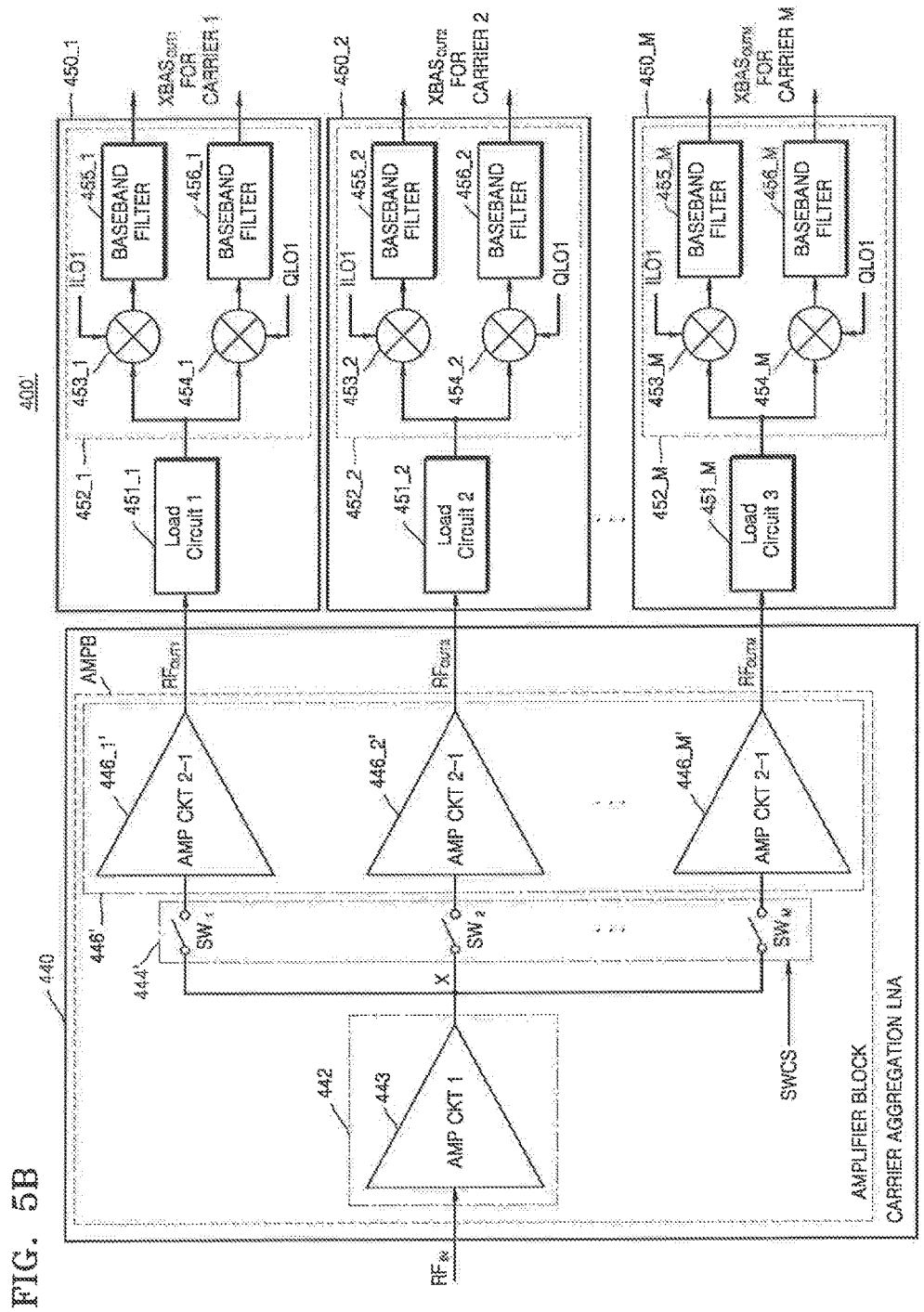

FIGS. 5A and 5B are block diagrams of the LNA 440 and the output circuit 450 of the receiver 400 of FIG. 4 according to an exemplary embodiment.

Referring to FIG. 5A, the receiver 400 includes the CA LNA 440 and the plurality of output circuits 450_1 to 450_M. The CA LNA 440 includes at least one amplifier block AMPB. The amplifier block AMPB includes a first amplification unit 442 and a second amplification unit 446. The first amplification unit 442 includes an amplification circuit 443 that amplifies the RF input signal $RF_{IN}$ and may offset non-linearity factors generated during the amplification. The second amplification unit 446 is connected to the first amplification unit 442 via an output node X of the first amplification unit 442, and receives an amplified RF input signal from the first amplification unit 442. The second amplification unit 446 includes a plurality of amplification circuits 446_1 to 446_M, and each of the amplification circuits 446_1 to 446_M may receive an enable/disable control signal EN/DIS_CS to control enabling and disabling. For example, when an RF signal transmitted by using G (where G is an integer smaller than M) carriers in the intra-band CA is received, G amplification circuits may be selected and enabled from among the amplification circuits 446_1 to 446_M, and the enabled amplification circuits may respectively output the RF output signals. For example, when G is less than the total number of available amplification circuits, the remaining amplification circuits can be disabled to conserve power. When it is assumed that RF signals transmitted by using M carriers in the intra-band CA are received, each of the amplification circuits 446_1 to 446_M may amplify the RF input signal, and offset the non-linearity factors generated during the amplification to output RF output signals $RF_{OUT1}$ to $RF_{OUTM}$.

As described above, the CA LNA 440 according to the present inventive concept may offset the non-linearity factors generated when a predetermined signal is amplified, to improve the gain features, the linearity of which is emphasized. Also, the second amplification unit 446 receives the amplified RF input signal from the first amplification unit 442 and amplifies the received RF input signal again, and accordingly, may output an RF output signal having a desired magnitude while consuming less of a direct current (DC) electric current.

The output circuits 450_1 to 450_M respectively include load circuits 451_1, 451_2, . . . , 451_M connected to the amplification circuits 446_1 to 446_M of the second amplification unit 446 and down-converter circuits 452_1 to 452_M. In an embodiment, the load circuits 451_1 to 451_M are baseband filters. A first down-converter circuit 452_1 includes two mixers 453_1 and 454_1, and baseband filters 455_1 and 456_1. The structure of the first down-converter circuit 452_1 may be applied to the other down-converter circuits 452_2 to 452_M. For example, a second down-converter circuit 452_2 includes two mixers 453_2 and 454_2, and baseband filters 455_2 and 456_2, and an M-th down-converter circuit 452_M includes mixers 453_M and 454_M, and baseband filters 455_M and 456_M. When it is assumed that RF signals transmitted by using M carriers in the intra-band CA are received, the output circuits 446_1 to 446_M may respectively convert the RF output signals $RF_{OUT\_1}$ to $RF_{OUTM}$ to baseband signals $XBAS_{OUT1}$ to $XBAS_{OUTM}$. The mixers 453_1, 453_2, . . . , 453_M may receive an inphase LO signal ILO1, and the mixers 454_1, 454_2, . . . , 454_M may receive a quadrature LO signal QLO1.

Referring to FIG. 5B, a receiver 400' further includes a switching unit 444' including a plurality of switch devices $SW_1, SW_2, \ldots, SW_M$, unlike the example illustrated in FIG. 5A. Accordingly, when the RF signals by using N carriers in the intra-band CA are received, the switching unit 444' may be controlled by a switching control signal SWCS so that N amplification circuits are selected from among amplification circuits 446_1' to 446_M'. However, embodiments of the inventive concept are not limited to the structures of the receivers 400 and 400' illustrated in FIGS. 5A and 5B.

Figure 6:
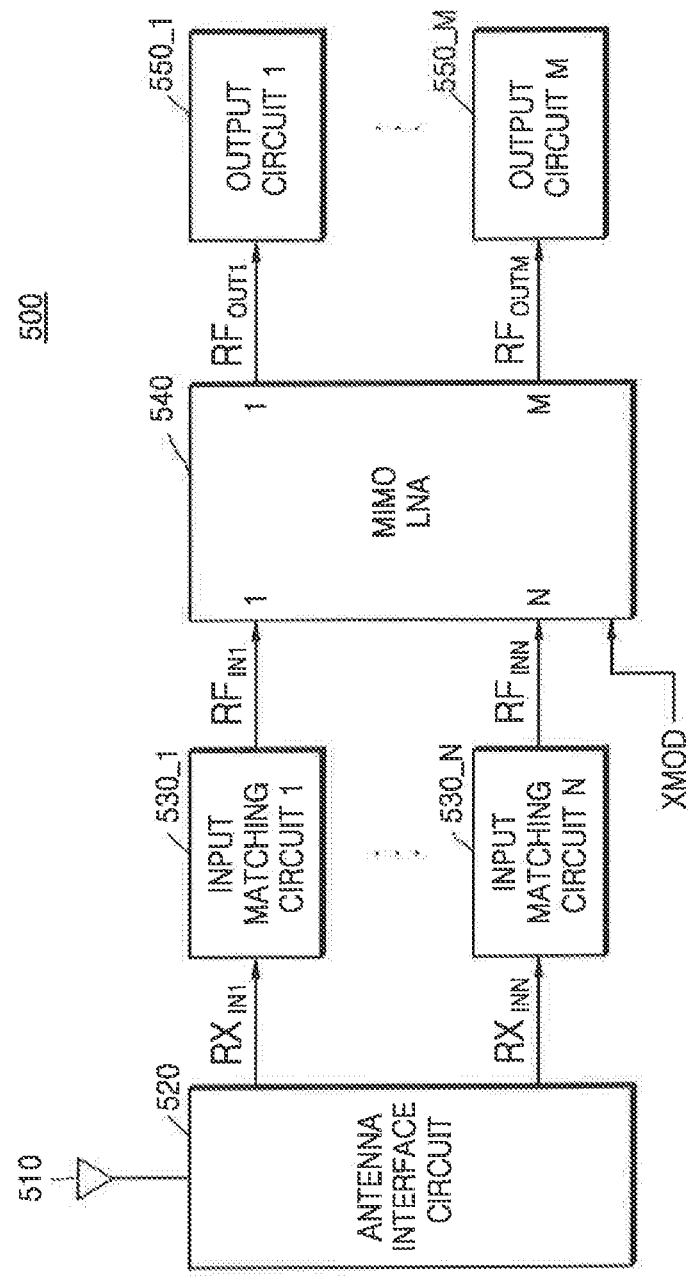
FIG. 6 is a block diagram of a receiver according to an exemplary embodiment of the present inventive concept.

FIG. 6 is a block diagram of a receiver 500 according to an exemplary embodiment of the present inventive concept. The receiver 500 may be used to implement one or more of receivers 230a to 230k and/or receivers 260a to 260l to FIG. 3.

Referring to FIG. 6, the receiver 500 includes a MIMO LNA 540 supporting non-CA, the intra-band CA, and the inter-band CA, an antenna 510, an antenna interface circuit 520, an input matching circuit, and a plurality of output circuits 550_1 to 550_M. The input matching circuit may include first through N-th input matching circuits 530_1 through 530_N. The MIMO LNA 540 may be operated on outputs of one of the LNAs 224 and 254 of FIG. 3. The MIMO LNA 540 may include multiple (N) input ends and multiple (M) output ends. The receiver 500 may receive an RF signal (or down-link signal) transmitted from a plurality of carriers or one carrier within the same frequency band or different frequency bands, via the antenna 510. The antenna 510 may provide the received RF signal to the antenna interface circuit 520. The antenna interface circuit 520 may perform a frequency filtering on the received RF signal. As an example, the antenna interface circuit 520 filters the RF signal to generate a first receiver input signal $RX_{IN1}$ that is transmitted by using the carrier in a first frequency band. Also, the antenna interface circuit 520 filters the RF signal to generate an N-th receiver input signal $RX_{INN}$ that is transmitted by using a carrier in an N-th frequency band. The antenna interface circuit 520 may generate one to N receiver input signals $RX_{IN1}$ to $RX_{INN}$, and may route to provide the receiver input signals to the input matching circuits 530_1 to 530_N. The input matching circuits 530_1 to 530_N may provide one to N RF input signals $RF_{IN1}$ to $RF_{INN}$ that are applied to the MIMO LNA 540 by performing an impedance matching operation.

The MIMO LNA 540 may receive one to N RF input signals $RF_{IN1}$ to $RF_{INN}$. For example, the MIMO LNA 540 may amplify one RF input signal transmitted from the non-CA or the intra-band CA to N RF input signals transmitted from the inter-band CA. The MIMO LNA 540 may amplify one to N RF input signals $RF_{IN1}$ to $RF_{INN}$ that may be received to output RF output signals $RF_{OUT\_1}$ to $RF_{OUTM}$ respectively to the output circuits 550_1 to 550_M.

In an embodiment, the MIMO LNA 540 receives a mode control signal XMOD from an outside source, and operates in one of a single output mode, an intra-band CA mode, and an inter-band CA mode based on a value or a level of the mode control signal XMOD. In the single output mode, the MIMO LNA 540 operates in a configuration of one input and one output. Also, the MIMO LNA 540 may receive the RF input signal including at least one signal transmitted by one carrier, and amplify the RF input signal to output one RF output signal. In the intra-band CA mode, the MIMO LNA 540 operates in a configuration of one input and M outputs, where M is greater than 1. Also, the MIMO LNA 540 may receive the RF input signal including a plurality of transmissions transmitted by a plurality of carriers in the same frequency band, and may output one to M RF output signals $RF_{OUT\_1}$ to $RF_{OUTM}$ respectively to the M output circuits 550_1 to 550_M. One RF output signal may correspond to one carrier. In the inter-band CA mode, the MIMO LNA 540 operates in a configuration of N inputs and M outputs, where N and M are greater than 1. Also, the MIMO LNA 540 may receive the RF input signal including a plurality of transmissions transmitted through one to M carriers in one to N different frequency bands, and may output the RF output signals $RF_{OUT\_1}$ to $RF_{OUTM}$ respectively to M output circuits 550_1 to 550_M. At least one of the output circuits 550_1 to 550_M may receive the RF output signal and down-convert the RF output signal to output the RF output signal as a baseband signal.

Figure 7A:
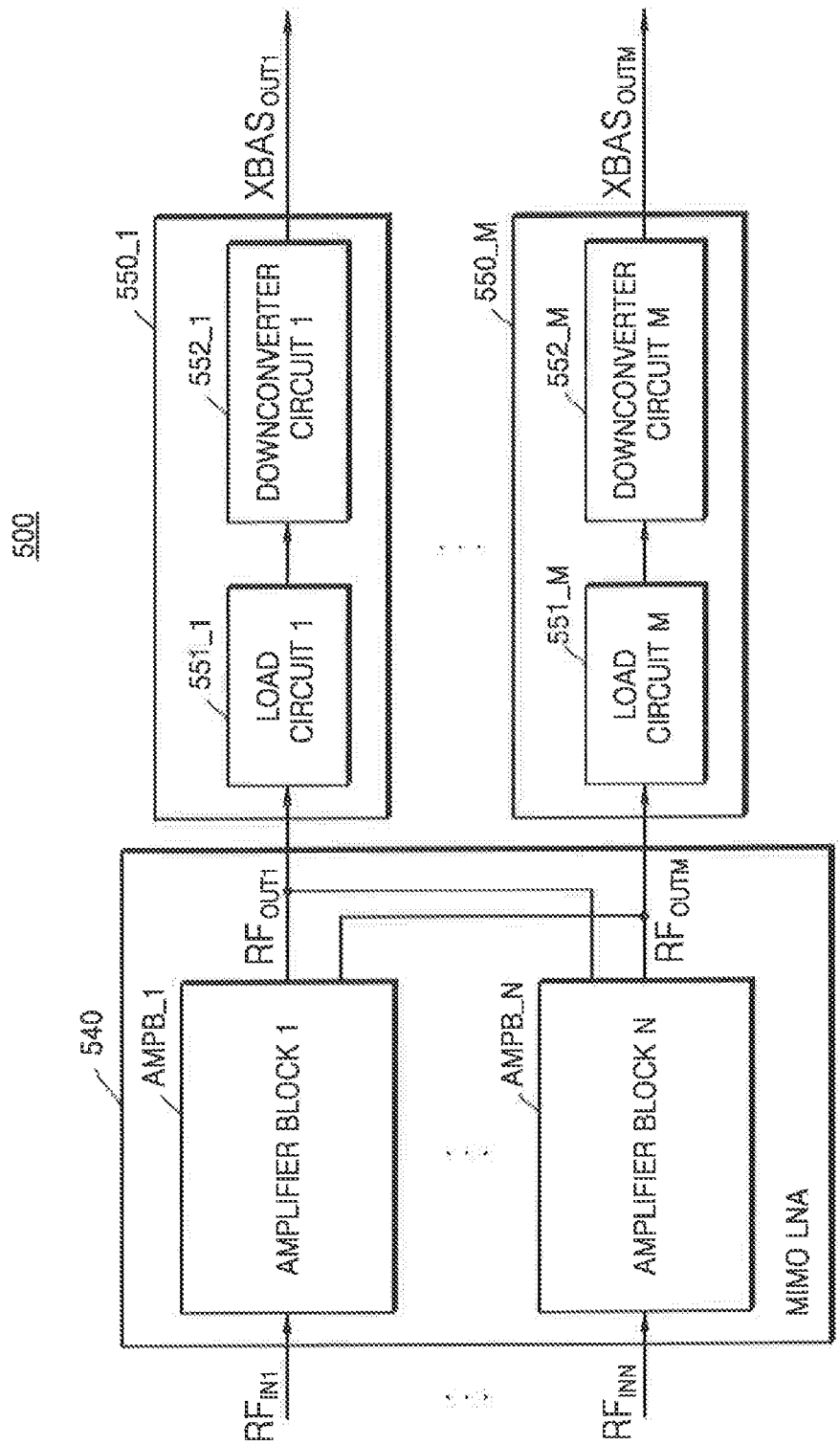
FIG. 7A is a block diagram of the receiver of FIG. 6 according to an exemplary embodiment of the inventive concept.
Figure 7B:
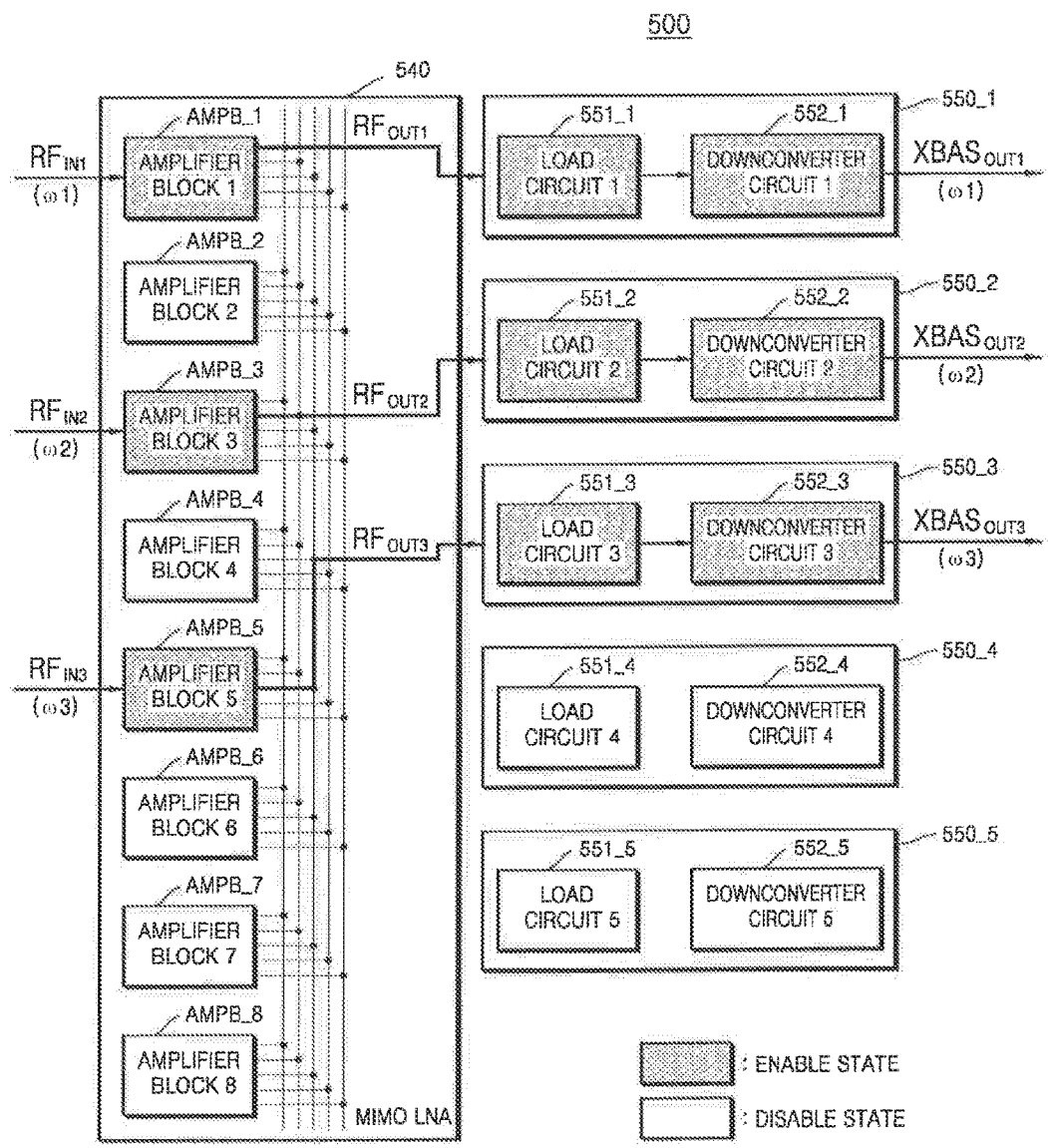
FIG. 7B is a block diagram illustrating operations of a receiver in an intra-band CA.
Figure 7C:
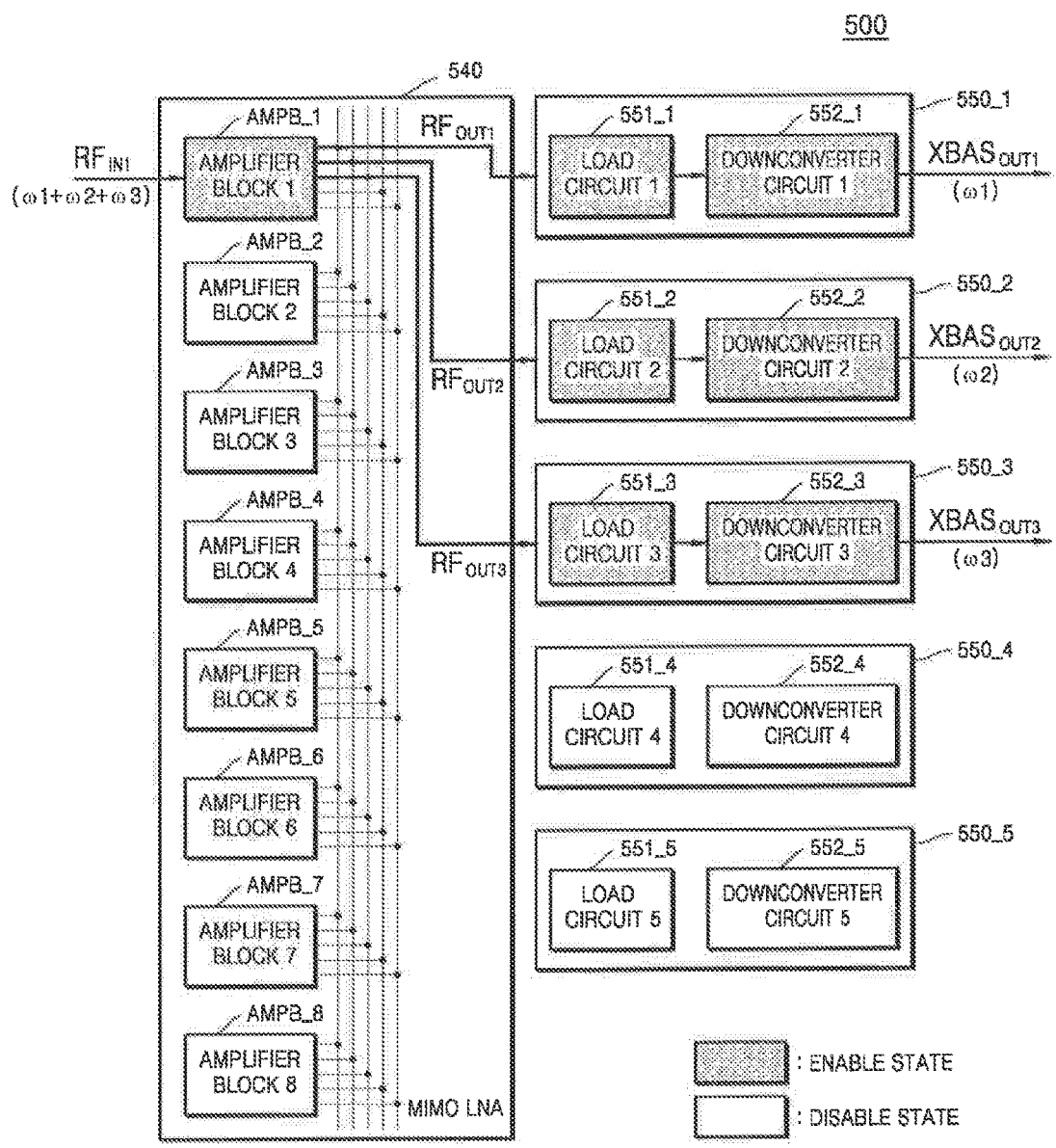
FIG. 7C is a block diagram illustrating operations of a receiver in an inter-band CA.

FIG. 7A is a block diagram of the receiver 500 of FIG. 6 according to an exemplary embodiment, FIG. 7B is a block diagram illustrating operations of the receiver in the intra-band CA, and FIG. 7C is a block diagram illustrating operations of the receiver in the inter-band CA.

Referring to FIG. 7A, the receiver 500 includes the MIMO LNA 540 and a plurality of output circuits 550_1 to 550_M. The MIMO LNA 540 includes a plurality of amplifier blocks AMPB_1 to AMPB_N. The plurality of amplifier blocks AMPB_1 to AMPB_N respectively receive the RF input signals $RF_{IN1}$ to $RF_{INN}$ and amplify the RF input signals $RF_{IN1}$ to $RF_{INN}$ to generate RF output signals $RF_{OUT1}$ to $RF_{OUTM}$, and may output the RF output signals $RF_{OUT1}$ to $RF_{OUTM}$. The plurality of amplifier blocks AMPB_1 to AMPB_N are connected to the output circuits 550_1 to 550_M. For example, a first amplifier block AMPB_1 may be connected to M output circuits 550_1 to 550_M, and the other amplifier blocks AMPB_2 to AMPB_M may be respectively connected to the M output circuits 550_1 to 550_M. A first output circuit 550_1 may include a load circuit 551_1 and a down-converter circuit 552_1. The structure of the first output circuit 550_1 may be applied to the other output circuits 550_M. For example, the m-th output circuit 550_M may include an m-th load circuit 551_M and an m-th down-converter circuit 552_M. The output circuits 550_1 to 550_M may each receive and down-convert one of the RF output signals $RF_{OUT1}$ to $RF_{OUT2}$, to output baseband signals $XBAS_{OUT1}$ to $XBAS_{OUTM}$.

FIG. 7B is a diagram illustrating operations of the receiver 500 in the inter-band CA. Referring to FIG. 7B, the receiver 500 includes the MIMO LNA 540 and first to five output circuits 550_1, 550_2, 550_3, 550_4, and 550_5, and the MIMO LNA 540 includes first to eighth amplifier blocks AMPB_1, AMPB_2, AMPB_3, AMPB_4, AMPB_5, AMPB_6, AMPB_7, and AMPB_8. The first output circuit 550_1 includes a first load circuit 551_1 and a first down-converter circuit 552_1, the second output circuit 550_2 includes a second load circuit 551_2 and a second down-converter circuit 552_2, the third output circuit 550_3 includes a third load circuit 551_3 and a third down-converter circuit 552_3, the fourth output circuit 550_4 includes a fourth load circuit 551_4 and a fourth down-converter circuit 552_1, and the fifth output circuit 550_5 includes a fifth load circuit 551_5 and a fifth down-converter circuit 552_5. Hereinafter, a case in which the base station transmits the RF signals by using a first carrier ω1 of the first frequency band, a second carrier ω2 of the third frequency band, and a third carrier ω3 of the fifth frequency band will be described.

First, some (AMPB_1, AMPB_3, and AMPB_5) of the amplifier blocks AMPB_1 to AMPB_8 are enabled, and the enabled amplifier blocks AMPB_1, AMPB_3, and AMPB_5 respectively receive first to third RF input signals $RF_{IN1}$ to $RF_{IN3}$ corresponding to the first to third carriers ω1 to ω3. The first amplifier block AMPB_1 amplifies the first RF input signal $RF_{IN1}$ and offsets the non-linearity factors generated during the amplification, and may output a first RF output signal $RF_{OUT1}$ to an enabled first output circuit 550_1. The third amplifier block AMPB_3 amplifies the second RF input signal $RF_{IN2}$ and offsets the non-linearity factors generated during the amplification, and may output a second RF output signal $RF_{OUT2}$ to an enabled second output circuit 550_2. Also, the fifth amplifier block AMPB_5 amplifies the third RF input signal $RF_{IN3}$ and offsets the non-linearity factors generated during the amplification, and may output a third RF output signal $RF_{OUT3}$ to an enabled third output circuit 550_3. The enabled output circuits 550_1 to 550_3 may output baseband signals $XBAS_{OUT1}$ to $XBAS_{OUT3}$ corresponding to the carriers ω1 to ω3.

FIG. 7C is a diagram illustrating operations of the receiver 500 in the intra-band CA. Referring to FIG. 7C, the receiver 500 includes the MIMO LNA 540 and first to five output circuits 550_1 to 550_5, and the MIMO LNA 540 includes first to eighth amplifier blocks AMPB_1 to AMPB_8. Hereinafter, a case in which the base station transmits the RF signals by using a first carrier $\omega 1$, a second carrier $\omega 2$, and a third carrier $\omega 3$ of the same frequency band will be described.

First, the first amplifier block AMPB_1 is enabled from among the amplifier blocks AMPB_1 to AMPB_8, and the enabled amplifier block AMPB_1 receives the first RF input signal $RF_{IN}1$ corresponding to the first to third carriers $\omega 1$ to $\omega 3$. The first amplifier block AMPB_1 amplifies the first RF input signal $RF_{IN1}$ and offsets the non-linearity factors generated during the amplification, and outputs a first RF output signal $RF_{OUT1}$ corresponding to the first carrier $\omega 1$ to an enabled first output circuit 550_1. Also, the first amplifier block AMPB_1 amplifies the first RF input signal $RF_{IN1}$ and offsets the non-linearity factors generated during the amplification, and outputs a second RF output signal $RF_{OUT2}$ corresponding to the second carrier $\omega 2$ to an enabled second output circuit 550_2. Last, the first amplifier block AMPB_1 amplifies the first RF input signal $RF_{IN1}$ and offsets the non-linearity factors generated during the amplification, and outputs a third RF output signal $RF_{OUT3}$ corresponding to the third carrier $\omega 3$ to an enabled third output circuit 550_3. The enabled output circuits 550_1 to 550_3 may output baseband signals $XBAS_{OUT1}$ to $XBAS_{OUT3}$ corresponding to the carriers $\omega 1$ to $\omega 3$. Hereinafter, features of the detailed structure of the amplifier block according to the embodiments of the present inventive concept will be described below.

Figure 8A:
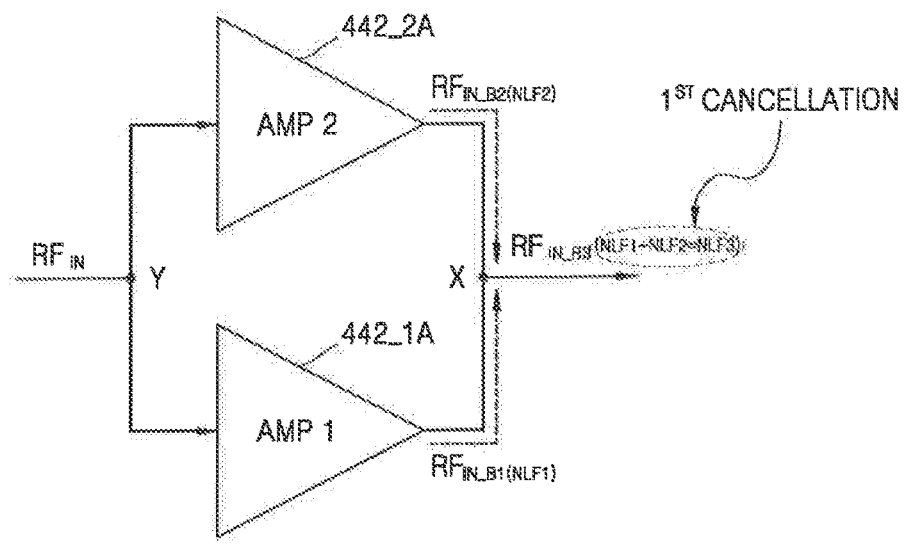
FIGS. 8A and 8B are block diagrams of a first amplifier of FIG. 5A according to an exemplary embodiment of the inventive concept.
Figure 8B:
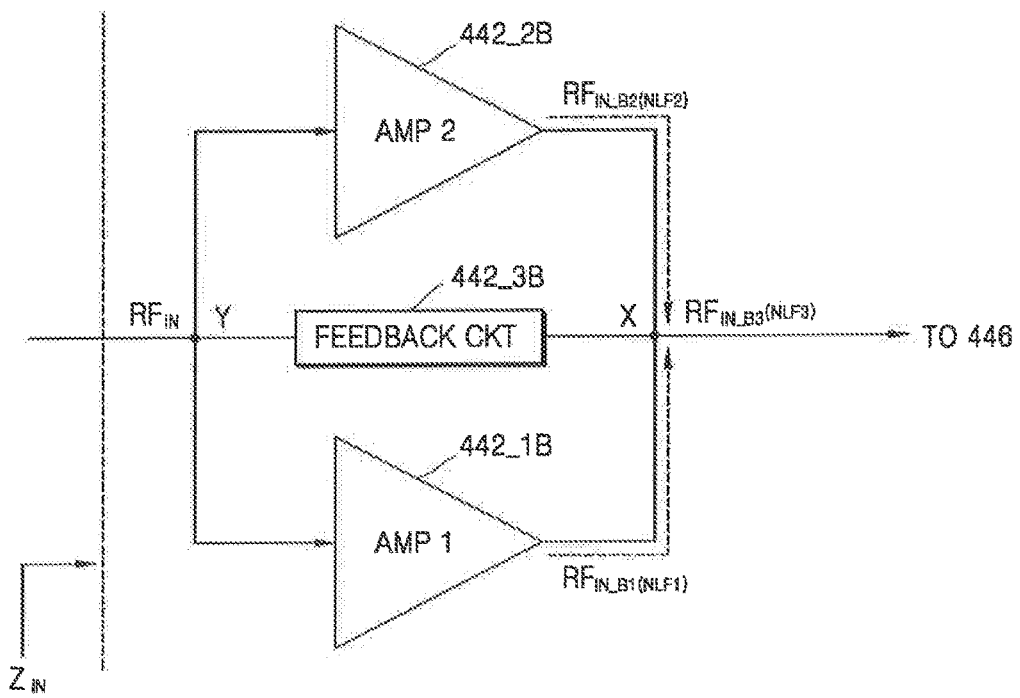

FIGS. 8A and 8B are block diagrams of the first amplification unit 442 of FIG. 5A according to an exemplary embodiment of the inventive concept.

Referring to FIG. 8A, the first amplification unit 442A includes a first input amplifier 442_1A and a second input amplifier 442_2A. The first input amplifier 442_1A and the second input amplifier 442_2A may be connected to each other in parallel. That is, an input end of the first input amplifier 442_1A and an input end of the second input amplifier 442_2A are connected through a Y node, and an output end of the first input amplifier 442_1A and an output end of the second input amplifier 442_2A are connected through an X node.

The first input amplifier 442_1A receives the RF input signal $RF_{IN}$, and amplifies the RF input signal $RF_{IN}$ to generate a first RF amplified signal $RF_{IN\_B1}$ including a first non-linearity factor NLF1. The second input amplifier 442_2A receives the RF input signal $RF_{IN}$, and amplifies the RF input signal to generate a second RF amplified signal $RF_{IN\_B2}$ including a second non-linearity factor NLF2. The non-linearity factor may be a signal generated when a signal is amplified by a predetermined amplifier, and the non-linearity factor may include at least one of factors hindering linearity of the amplifier. As an example, when the amplifier includes a transistor, signals generated by coefficients related to transconductance of the transistor may correspond to the non-linearity factors.

As an example, features of the first input amplifier 442_1A and features of the second input amplifier 442_2A are set differently from each other, and then, a sign of the first non-linearity factor NLF1 generated by the first input amplifier 442_1A is different from that of the second non-linearity factor NLF2 generated by the second input amplifier 442_2A. For example, when the first non-linearity factor NLF1 has a plus sign, the second non-linearity factor NLF2 has a minus sign. The first RF amplified signal $RF_{IN\_B1}$ and the second RF amplified signal $RF_{IN\_B2}$ may be combined at the X node and output as a third RF amplified signal $RF_{IN\_B3}$. Here, since the sign of the first non-linearity factor NLF1 and the sign of the second non-linearity factor NLF2 are different from each other, the first non-linearity factor NLF1 and the second non-linearity factor NLF2 may be offset by each other. The offset of the non-linearity factors in the first amplification unit 442A may be referred to as a first cancellation. As a result, the third RF amplified signal $RF_{IN\_B3}$ may include a third non-linearity factor NLF3 that is a result of the offset between the first non-linearity factor NLF1 and the second non-linearity factor NLF2.

Referring to FIG. 8B, a first amplification unit 442B may further include a feedback circuit 442_3B, when compared with the configuration of the first amplification unit 442A of FIG. 8A. The feedback circuit 442_3B may be connected to a first input amplifier 442_1B and a second input amplifier 442_2B in parallel. That is, the feedback circuit 442_3B may be connected between the X node and the Y node. Since the first amplification unit 442B includes the feedback circuit 442_3B, an input impedance $Z_{IN}$ of the first amplification unit 442B may be maintained constantly at a predetermined value. In an embodiment, the feedback circuit 442_3B is configured so that the input impedance $Z_{IN}$ of the first amplification unit 442B corresponds to a predetermined target impedance (e.g., 50 Ohms). Also, the feedback circuit 442_3B may allow an input matching operation with respect to an LNA including the first amplification unit 442B to be sufficiently performed. Moreover, the feedback circuit 442_3B may set the amplification gain of the first amplification unit 442B to be constant so that the linearity of the first amplification unit 442B may be improved.

Figure 9A:
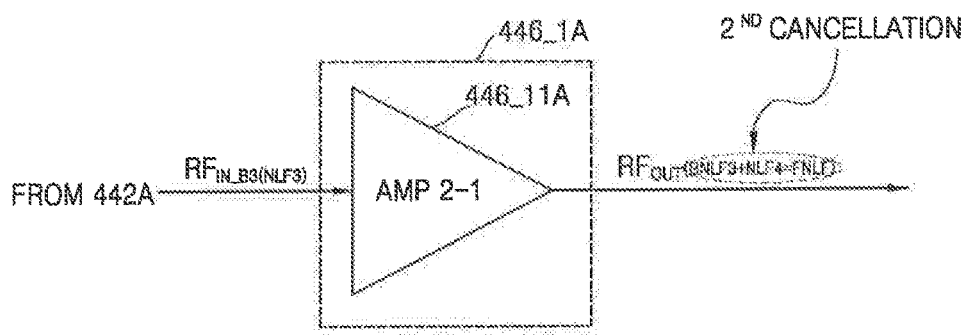
FIGS. 9A and 9B are block diagrams of a second amplifier of FIG. 5A according to an exemplary embodiment of the inventive concept.
Figure 9B:
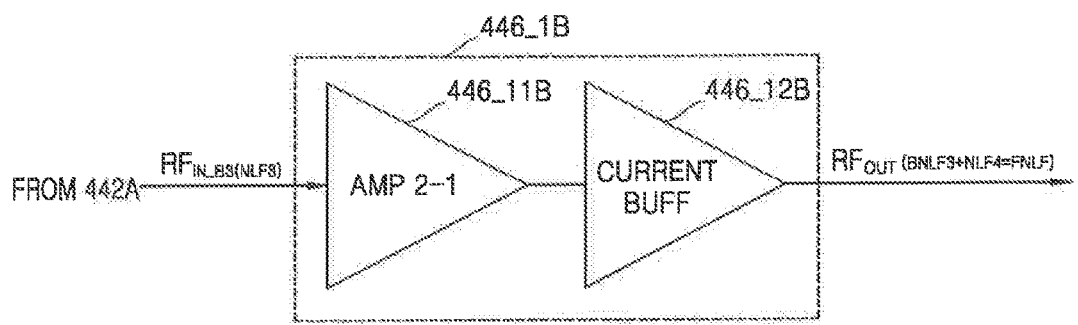

FIGS. 9A and 9B are block diagrams showing examples of the second amplification unit 446 of FIG. 5A.

Referring to FIG. 9A, like in FIG. 5A, a second amplification unit 446A may include a plurality of amplification circuits. An amplification circuit 446_1A may be one of the plurality of amplification circuits, and the configuration of the amplification circuit 446_1A may be applied to the plurality of amplification circuits. The amplification circuit 446_1A includes an amplifier 446_11A. The amplifier 446_11A receives the third RF amplified signal $RF_{IN\_B3}$ including the third non-linearity factor NLF3 from the first amplification unit 442A. The amplifier 446_11A may generate an RF output signal $RF_{OUT}$ by amplifying the third RF amplified signal $RF_{IN\_B3}$. The amplifier 446_11A according to an embodiment of the inventive concept generates a fourth non-linearity factor NLF4 having a sign that is different from that of the third amplified non-linearity factor BNLF3 when amplifying the third RF amplified signal $RF_{IN\_B3}$. Here, when the amplifier 446_11A amplifies the third RF amplified signal, the amplifier 446_11A may offset the generated fourth non-linearity factor NLF4 and the amplified third non-linearity factor BNLF3 by adding them. The offsetting of the non-linearity factors in the second amplification unit 446A may be referred to as a second cancellation. As a result, the RF output signal $RF_{OUT}$ may include a final non-linearity factor FNLF that is a result of the offset between the fourth non-linearity factor NLF4 and the amplified third non-linearity factor BNLF3. The final non-linearity factor FNLF may have a value of 0 or nearly close to 0. As such, the second amplification unit 446A removes the non-linearity factors, and improves the linearity of the second amplification unit 446A. However, the inventive concept is not limited to the first amplification unit 442A and the second amplification unit 446A illustrated in FIGS. 8A and 9A. For example, the first amplification unit 442A or the second amplification unit 446A may include more circuit configurations for offsetting the non-linearity factors, in addition to the first cancellation and the second cancellation.

Referring to FIG. 9B, an amplification circuit 446_1B of a second amplification unit 446B may further include a current buffer 446_12B, when compared with the second amplification unit 446A of FIG. 9A. Due to the current buffer 446_12B, a large input/output impedance may be provided to the amplification circuit 446_1B, and accordingly, the amplification gain of the amplification circuit 446_1B may be improved. Also, the degree in variation of the current flowing through the amplification circuit 446_1B may be reduced by the current buffer 446_12B, and thus, a stabile amplification operation may be performed.

Figure 10:
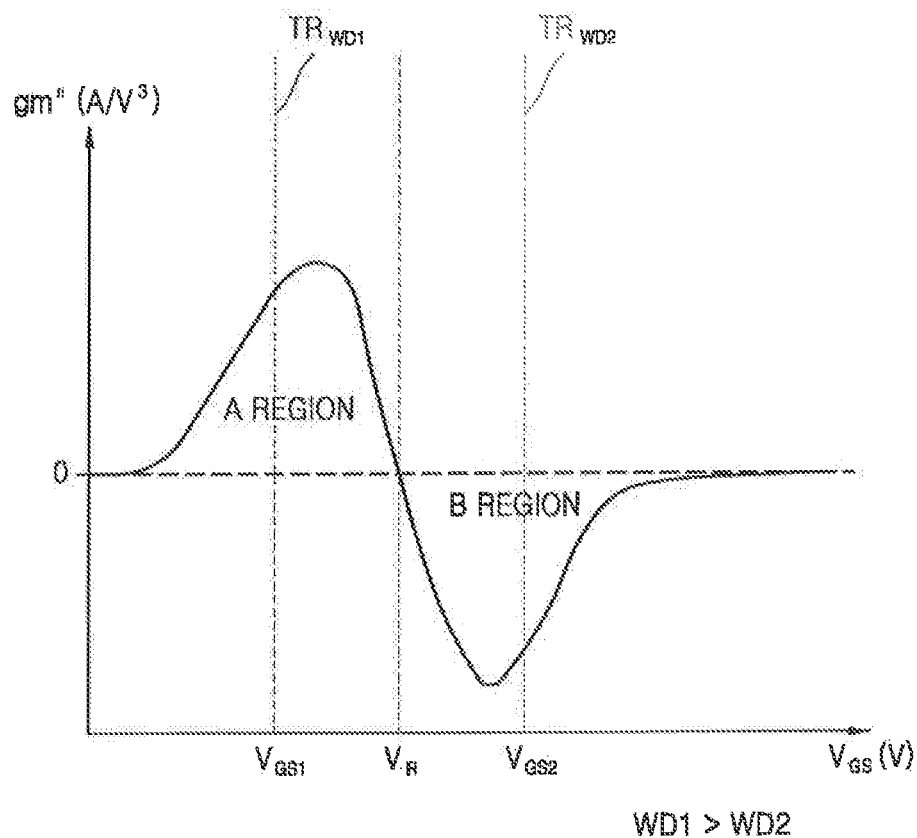
FIG. 10 is a graph illustrating a non-linearity factor that is to be compensated for, according to an exemplary embodiment of the present inventive concept.

FIG. 10 is a graph illustrating a non-linearity factor that is to be offset, according to an exemplary embodiment of the present inventive concept.

Referring to FIG. 10, a transconductance second-order derivative gm" of the transistor with respect to an amplifier including a predetermined transistor becomes a factor hindering the linearity during the amplification operation of the amplifier. In particular, a value of gm" varies depending on a gate-source voltage (VGS) or a bias voltage of the transistor. In more detail, based on a predetermined reference value VR, gm" may have a positive value in a region A and may have a negative value in a region B. Although characteristics of gm" of the transistor may vary depending on circuit configuration of the transistor, descriptions below will be provided based on a graph of FIG. 10.

Figure 11A:
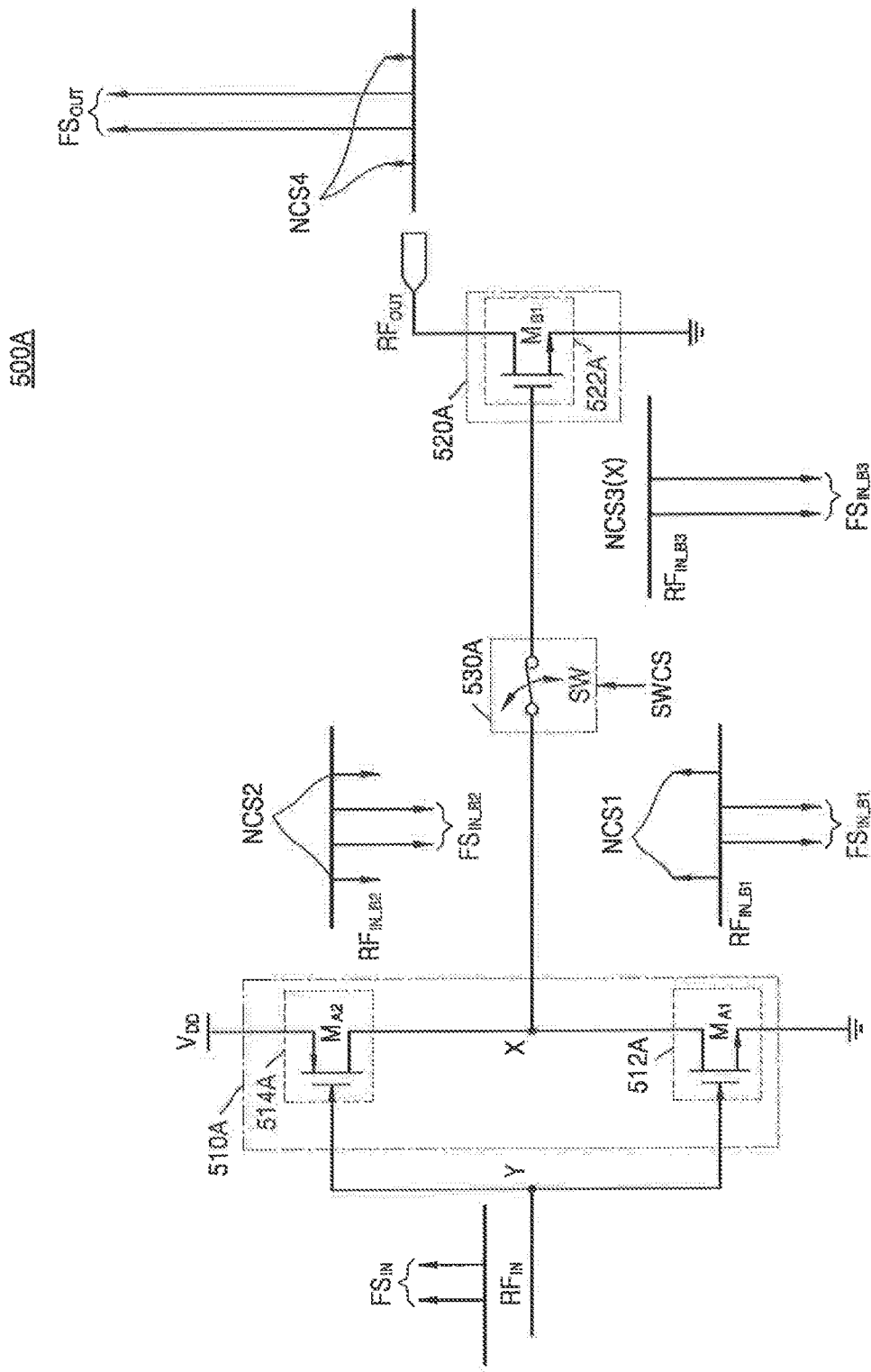
FIGS. 11A, 11B, and 11C are detailed circuit diagrams of a low noise amplifier (LNA) according to an exemplary embodiment of the present inventive concept.
Figure 11B:
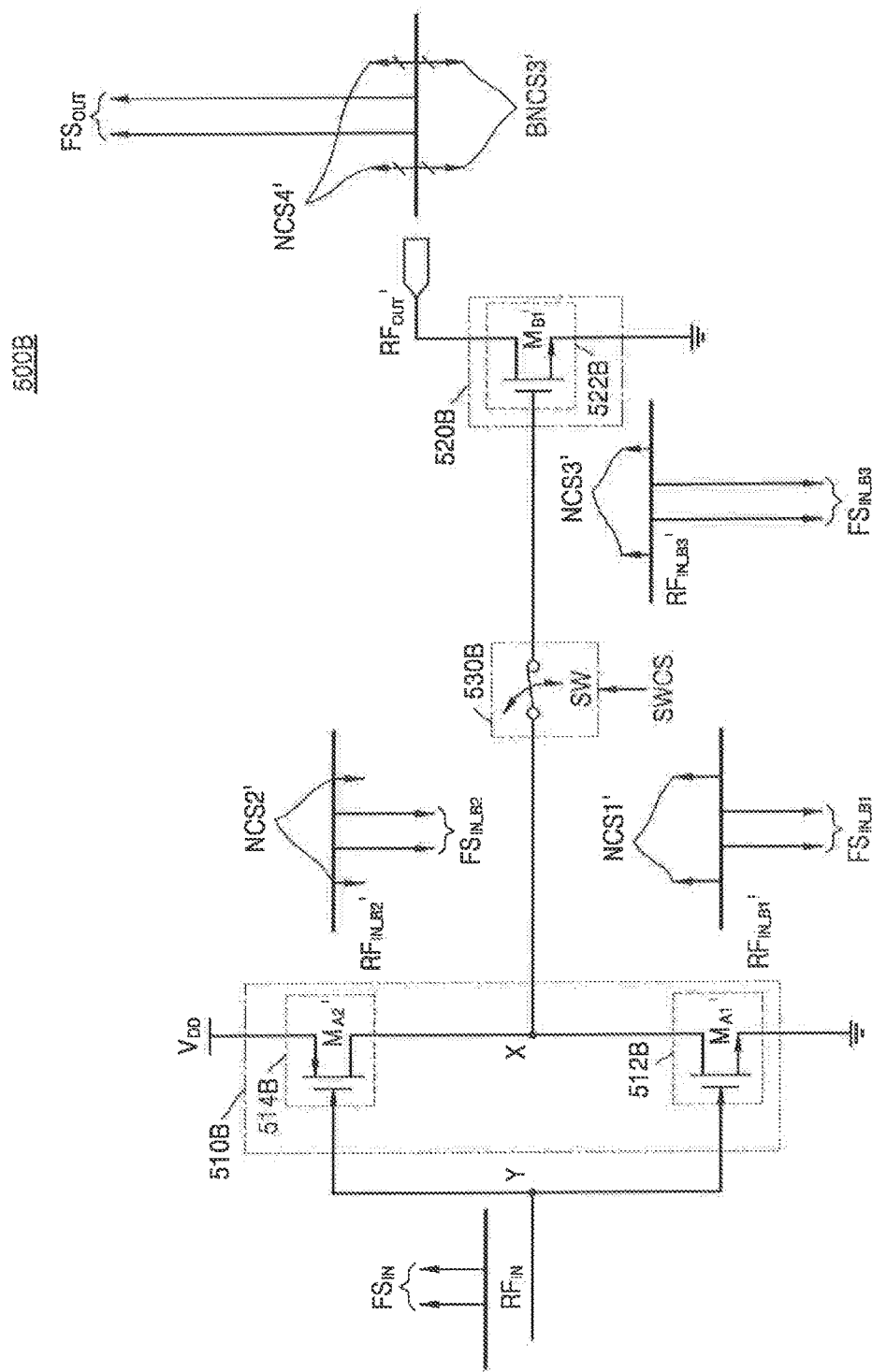

FIGS. 11A and 11B are detailed circuit diagrams of LNAs 500A and 500B according to an exemplary embodiment of the present inventive concept.

Referring to FIG. 11A, the LNA 500A includes a first amplification unit 510A, a second amplification unit 520A, and a switch 530A. In second amplification units 520A, 520B, and 520C in FIGS. 11A to 11C, only one of a plurality of amplification circuits is shown. The first amplification unit 510A includes a first input amplifier 512A and a second input amplifier 514A. The first input amplifier 512A includes an $M_{A1}$ transistor that is an NMOS transistor, and the second input amplifier 514A includes an $M_{A2}$ transistor that is a PMOS transistor. A source of the $M_{A1}$ transistor and a drain of the $M_{A2}$ transistor may be connected to each other via the X node, and a gate of the $M_{A1}$ transistor and a gate of the $M_{A2}$ transistor may be connected to each other via the Y node. A source of the $M_{A2}$ transistor may receive a power supply voltage VDD and a drain of the $M_{A1}$ transistor may receive a ground voltage. The second amplification unit 520A includes an amplifier 522A, and the amplifier 522A includes an $M_{B1}$ transistor that is an NMOS transistor. The switch 530A includes a switch device SW that is turned on/turned off according to a switching control signal SWCS, and hereinafter, it will be described under an assumption that the switch device SW is in a turned-on state.

First, the RF input signal $RF_{IN}$ is applied to the gate of the $M_{A1}$ transistor and the gate of the $M_{A2}$ transistor. The $M_{A1}$ transistor amplifies the RF input signal $RF_{IN}$ to generate a first RF amplified signal $RF_{IN\_B1}$. Hereinafter, a non-linearity cause signal is a signal corresponding to the above-described non-linearity factor, and a fundamental signal may be a signal including information required by the data processor 280 of FIG. 3 to perform a data processing operation.

The first RF amplified signal $RF_{IN\_B1}$ may include a first non-linearity cause signal NCS1 corresponding to the non-linearity factor and a first fundamental signal $FS_{IN\_B1}$. The $M_{A2}$ transistor may amplify the RF input signal to generate the second RF amplified signal $RF_{IN\_B2}$. The second RF amplified signal $RF_{IN\_B2}$ may include a second non-linearity cause signal NCS2 corresponding to the non-linearity factor and a second fundamental signal $FS_{IN\_B2}$. The non-linearity cause signal is generated by the gm" component of the transistor, and may be the cause of reducing linearity of the first or second amplification unit 510A or 520A.

In the first amplification unit 510A according to an embodiment, in order to offset the first non-linearity cause signal NCS1 and the second non-linearity cause signal NCS2, the first input amplifier 512A may generate the first non-linearity cause signal NCS1 having a positive value and the second input amplifier 514A may generate the second non-linearity cause signal NCS2 having a negative value. In an embodiment, in order to generate the non-linearity cause signals having different signs, a bias voltage of the $M_{A1}$ transistor is different from that of the $M_{A2}$ transistor. In an embodiment, in order to adjust magnitudes of the non-linearity cause signals having different signs, a width (or width function) of the $M_{A1}$ transistor is different from that of the $M_{A2}$ transistor. The amplifier including the transistor may require less bias voltage than is necessary to reach a target amplification gain as the width of the transistor increases.

Referring to FIG. 10, when a first transistor $TR_{WD1}$ has a first width WD1 and a second transistor $TR_{WD2}$ has a second width WD2 that is less than the first width WD1, the first transistor $TR_{WD1}$ requires a first bias voltage $V_{GS1}$ and the second transistor $TR_{WD2}$ requires a second bias voltage $V_{GS2}$ that is greater than the first bias voltage $V_{GS1}$ in order to reach the same target gain. When the first bias voltage $V_{GS1}$ is applied to the first transistor $TR_{WD1}$, gm" of the first transistor $TR_{WD1}$ may have a positive value, and when the second bias voltage $V_{GS2}$ is applied to the second transistor $TR_{WD2}$, gm" of the second transistor $TR_{WD2}$ may have a negative value.

Based on the above characteristics, the widths of the $M_{A1}$ transistor and the $M_{A2}$ transistor may be set so that the gm" of the $M_{A1}$ transistor has a negative value and the gm" of the $M_{A2}$ transistor has a positive value, and the amplifier may be designed based thereon. In summary, an operation region of the $M_{A1}$ transistor and an operation region of the $M_{A2}$ transistor are differently set, and thus, the non-linearity factors may be offset at the same time of the amplification.

As an example, the widths of the $M_{A1}$ transistor and the $M_{A2}$ transistor may be set so that an absolute value of the first non-linearity cause signal NCS1 generated by the first input amplifier 512A and an absolute value of the second non-linearity cause signal NCS2 generated by the second input amplifier 514A are equal to each other. As an example, the width of the $M_{A2}$ transistor may be greater than that of the $M_{A1}$ transistor. Here, the third RF amplified signal $RF_{IN\_B3}$ output from the X node after the first RF amplified signal $RF_{IN\_B1}$ and the second RF amplified signal $RF_{IN\_B2}$ are combined so they do not include the non-linearity cause signal NCS3, but include only a third fundamental signal $FS_{IN\_B3}$.

The third RF amplified signal $RF_{IN\_B3}$ may be applied to a gate of an $M_B$, transistor. The $M_{B1}$ transistor may amplify the third RF amplified signal $RF_{IN\_B3}$ to generate an RF output signal $RF_{OUT}$. The RF output signal $RF_{OUT}$ may include a fundamental output signal $FS_{OUT}$ and a fourth non-linearity cause signal NCS4. The RF output signal $RF_{OUT}$ does not include the non-linearity cause signal besides the fourth non-linearity cause signal NCS4 due to the offsetting of the non-linearity cause signals in the first amplification unit 510A, and thus may ensure the linearity.

A drain of the $M_{B1}$ transistor may receive a ground voltage and a source of the $M_{B1}$ transistor may provide the RF output signal $RF_{OUT}$.

Referring to FIG. 11B, the LNA 500B includes an $M_{A1'}$ transistor, an $M_{A2'}$ transistor, and an $M_{B1'}$ transistor having widths different respectively from the $M_{A1}$ transistor, the $M_{A2}$ transistor, and the $M_{B1}$ transistor included in the LNA 500A of FIG. 11A. A first non-linearity cause signal NCS1' generated by a first input amplifier 512B has a plus sign and a second non-linearity cause signal NCS2' generated by a second input amplifier 514B has a minus sign, and widths of the $M_{A1'}$ transistor and the $M_{A2'}$ transistor may be set so that an absolute value of the first non-linearity cause signal NCS1' is greater than an absolute value of the second non-linearity cause signal NCS2'. As an example, a width of the $M_{A2'}$ transistor may be greater than that of the $M_{A1'}$ transistor. As a result, a third RF amplified signal $RF_{IN\_B3'}$ generated by the first amplifier 510B may include a third non-linearity cause signal NCS3' having a predetermined positive value.

An amplifier 522B may amplify the third RF amplified signal $RF_{IN\_B3'}$ to output an RF output signal $RF_{OUT'}$. In an embodiment, a width of the $M_{B1'}$ transistor is set so that a fourth non-linearity cause signal NCS4' generated by the amplifier 522B has a sign that is different from that of a third amplified non-linearity cause signal BNCS3' and has an absolute value the same as that of the third amplified non-linearity cause signal BNCS3'. As an example, as described above with reference to FIG. 10, the width of the $M_{B1'}$ transistor may be set so that gm" of the $M_{B1'}$ transistor has a positive value. Accordingly, the fourth non-linearity cause signal NCS4' and the third amplified non-linearity cause signal BNCS3' may be offset by each other, and the RF output signal $RF_{OUT'}$ may include only the fundamental output signal $FS_{OUT}$. Therefore, the linearity of the LNA 500B may be improved.

Figure 11C:
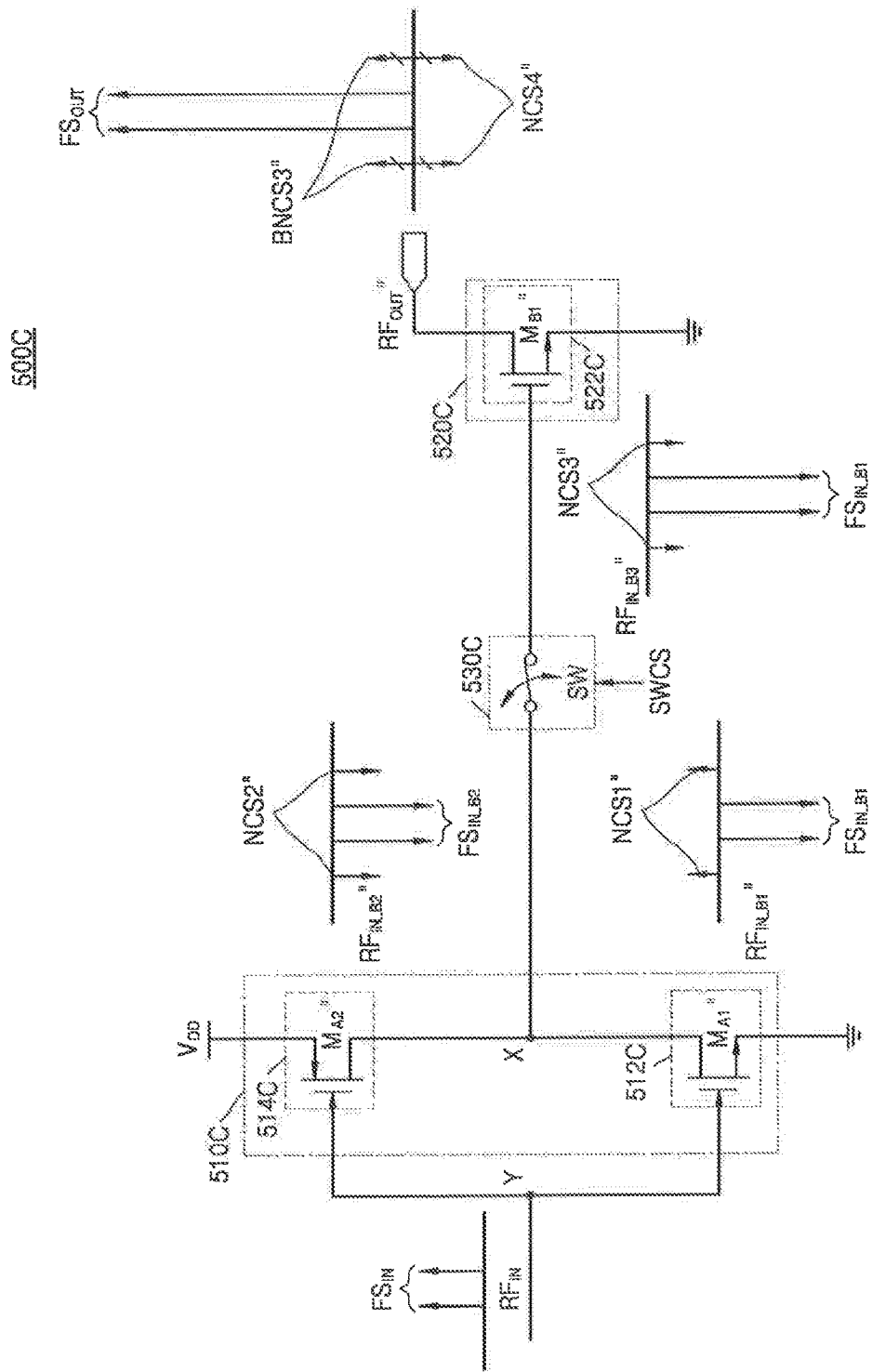

Referring to FIG. 11C, an LNA 500C includes an $M_{A1''}$ transistor and an $M_{A2''}$ transistor having widths that are different respectively from those of the $M_{A1'}$ transistor and the $M_{A2'}$ transistor included in the LNA 500B of FIG. 11B. As an example, widths of the $M_{A1''}$ transistor and the $M_{A2''}$ transistor may be set so that a first non-linearity cause signal NCS1" generated by a first input amplifier 512C has a plus sign and a second non-linearity cause signal NCS2" generated by a second input amplifier 514C has a minus sign, and an absolute value of the first non-linearity cause signal NCS1" is smaller than that of the second non-linearity cause signal NCS2". As an example, a width of the $M_{A1''}$ transistor may be smaller than that of the $M_{A2''}$ transistor. As a result, a third RF amplified signal $RF_{IN\_B3''}$ generated by the first amplifier 510C may include a third non-linearity cause signal NCS3" having a predetermined negative value.

An amplifier 522C may amplify the third RF amplified signal $RF_{IN\_B3''}$ to output an RF output signal $RF_{OUT''}$. A width of the $M_{B1''}$ transistor may be set so that a fourth non-linearity cause signal NCS4" generated by the amplifier 522C has a sign that is different from that of a third amplified non-linearity cause signal BNCS3" and have an absolute value equal to that of the third amplified non-linearity cause signal BNCS3". As an example, as illustrated above with reference to FIG. 10, the width of the $M_{B1''}$ transistor may be set so that the gm" of the $M_{B1''}$ transistor has a negative value. Accordingly, the fourth non-linearity cause signal NCS4" and the third amplified non-linearity cause signal BNCS3" may be offset by each other, and the RF output signal $RF_{OUT''}$ may only include the fundamental output signal $FS_{OUT''}$. Therefore, the linearity of the LNA 500C may be improved. However, the inventive concept is not limited to the embodiments of the LNA illustrated with reference to FIGS. 11A to 11C. In addition, various embodiments may be provided in which the first cancellation between the non-linearity cause signals in the first amplifier and the second cancellation between the non-linearity cause signals in the second amplifier.

Figure 12A:
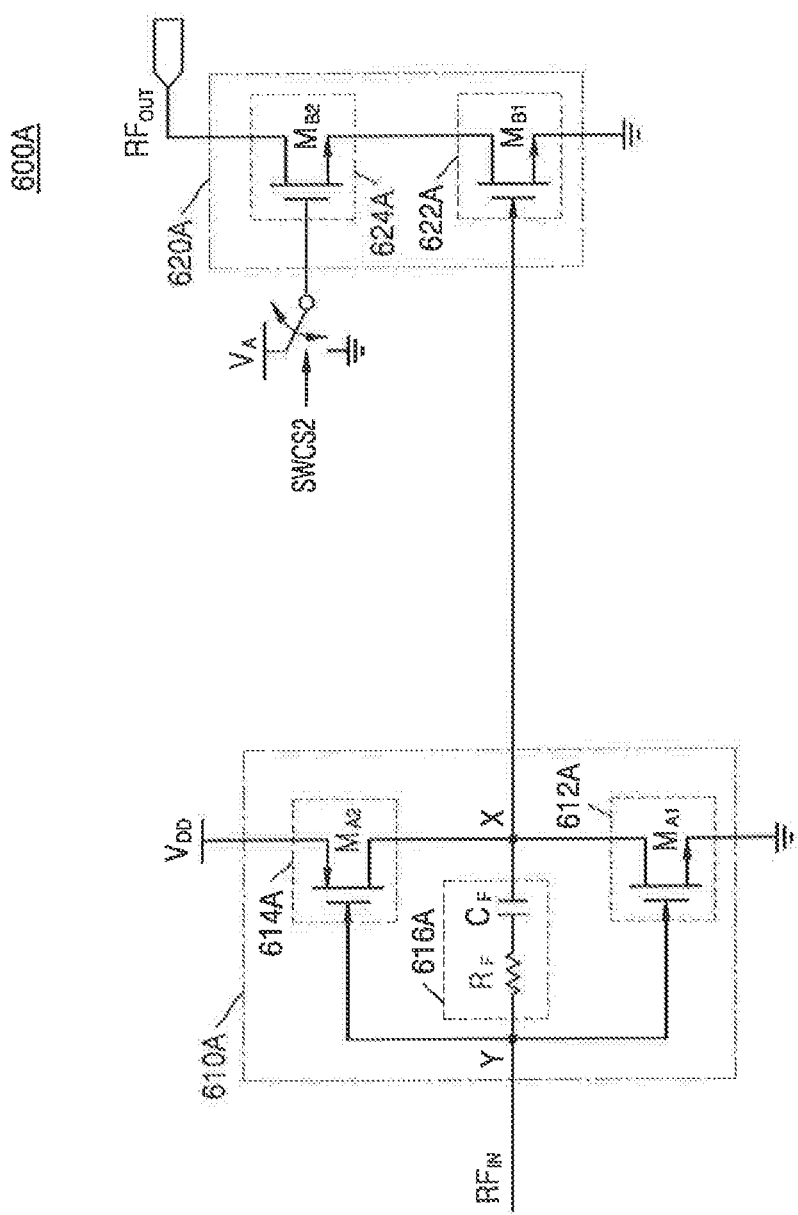
FIGS. 12A, 12B, and 12C are detailed circuit diagrams of a LNA according to an exemplary embodiment of the present inventive concept.
Figure 12B:
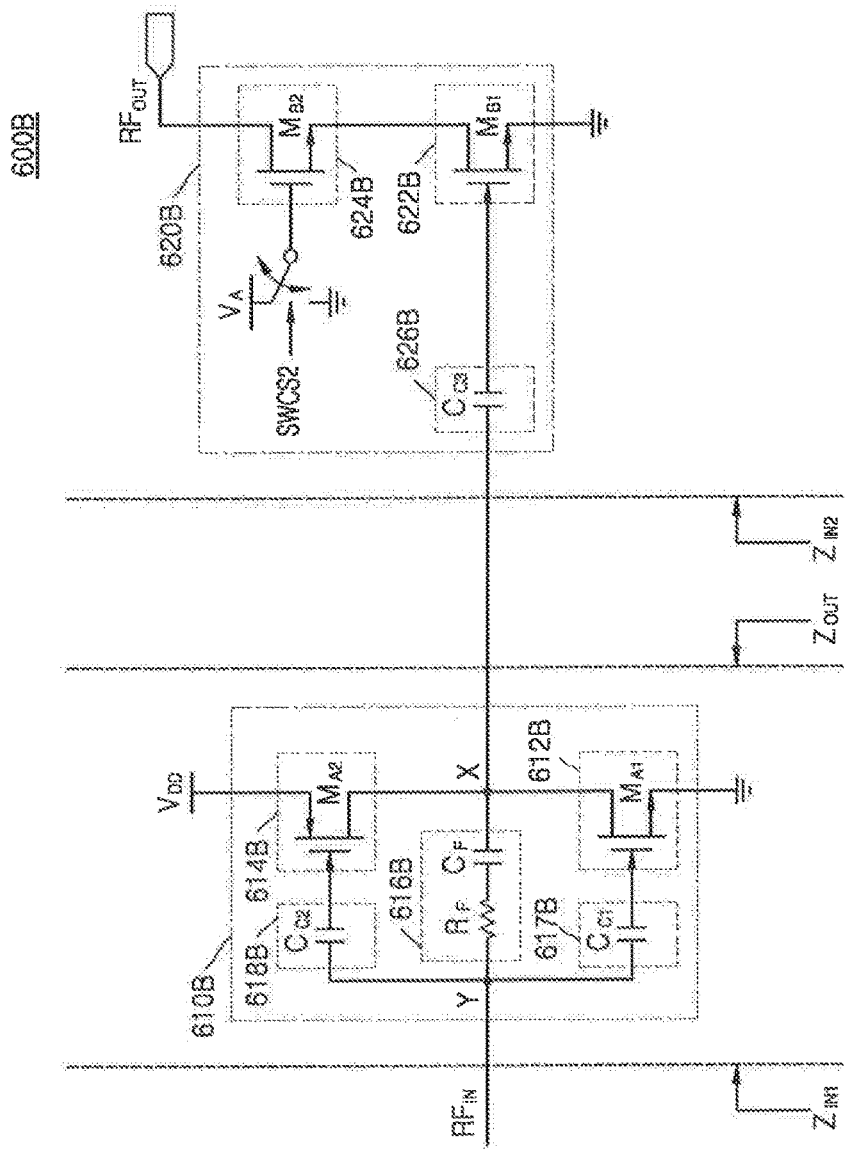
Figure 12C:
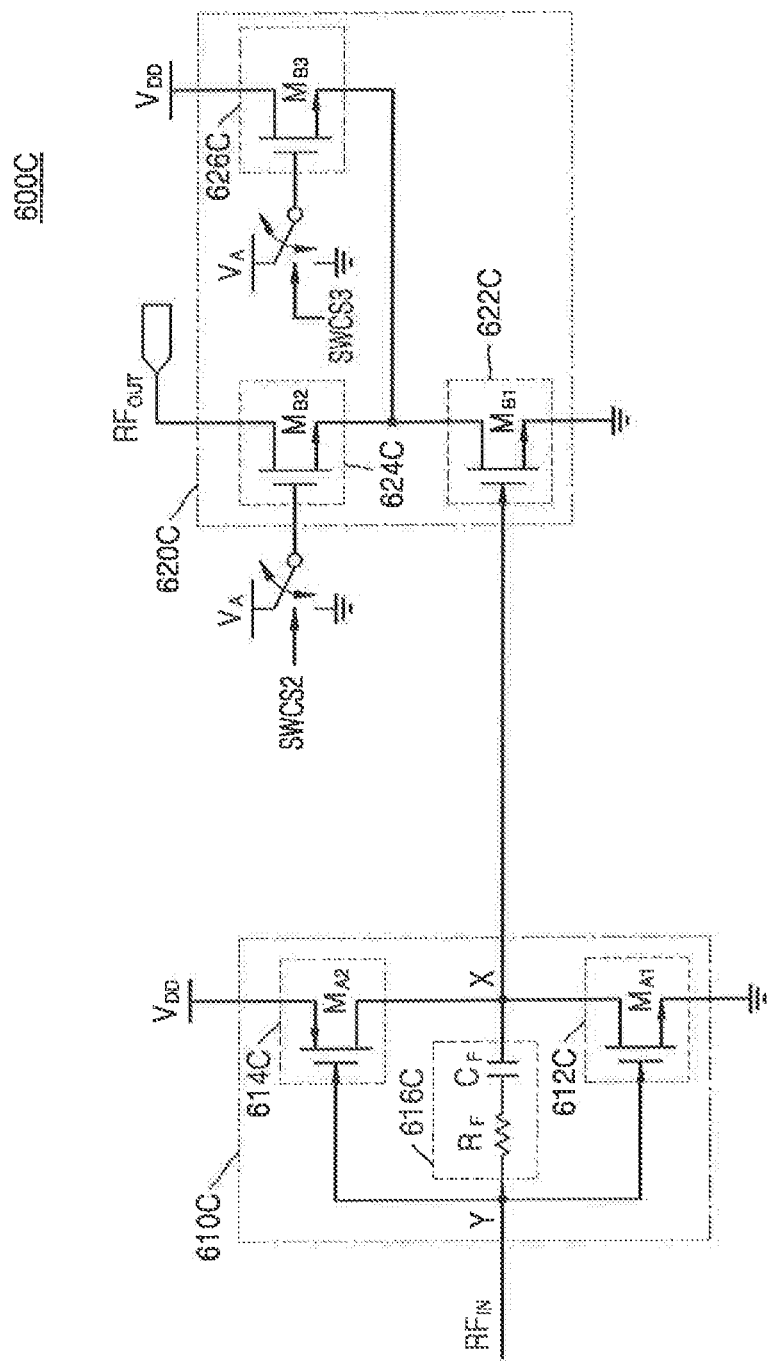

FIGS. 12A to 12C are detailed circuit diagrams of LNAs 600A, 600B, and 600C according to an exemplary embodiment of the present inventive concept.

Referring to FIG. 12A, the LNA 600A includes a first amplification unit 610A and a second amplification unit 620A. FIGS. 12A to 12C show only one of a plurality of amplification circuits included in the second amplification unit 620A. The first amplification unit 610A includes a first input amplifier 612A, a second input amplifier 614A, and a feedback circuit 616A. The feedback circuit 616A may include a resistor device RF (e.g., a resistor) and a capacitor device CF. The resistor device RF and the capacitor device CF may be connected to each other in series. The feedback circuit 616A is connected to the Y node and the X node to be connected to the first input amplifier 612A and the second input amplifier 614A in parallel. Configurations of the first input amplifier 612A and the second input amplifier 614A are described above with reference to FIGS. 11A to 11C, and thus, detailed descriptions thereof are omitted here.

The second amplification unit 620A includes an amplifier 622A and a current buffer 624A. The current buffer 624A may include an $M_{B2}$ transistor that is an NMOS transistor. The $M_{B2}$ transistor may form a cascade structure with the $M_{B1}$ transistor of the amplifier 622A, and may be referred to as a cascade transistor. As an example, turning on/turning off of the $M_{B2}$ transistor may be controlled according to a switching control signal SWCS2. The second amplification unit 620A may be enabled or disabled by controlling the turning-on/turning-off of the $M_{B2}$ transistor.

Referring to FIG. 12B, a first amplification unit 610B and a second amplification unit 620B may further include first and second interconnection circuits 617B, 618B, and 626B, when compared with the configuration of the LNA 600A of FIG. 12A. The first interconnection circuit 617B may include a $C_{C1}$ coupling capacitor having a sufficiently large capacitance so as to have less impedance than the transconductance (or 1/gm) of the $M_{A1}$ transistor. The second interconnection circuit 618B may include a $C_{C2}$ coupling capacitor having a sufficiently large capacitance so as to have less impedance than the transconductance (or 1/gm) of the $M_{A2}$ transistor. Also, a first interconnection circuit 626B may include a $C_{C3}$ coupling capacitor having a sufficiently large capacitance so as to have less impedance than the transconductance (or 1/gm) of the $M_{B1}$ transistor.

An input impedance $Z_{IN1}$ to the first amplification unit 610B may have a constant target impedance due to the feedback circuit 616A, as described above with reference to FIG. 8B. Accordingly, an amplification gain of the first amplification unit 610B may have a constant value, so as to improve linearity of the LNA 600B. Also, with respect to an input impedance $Z_{IN2}$ to the second amplification unit 620B, as described above with reference to FIG. 9B, the second amplification unit 620B may have large input/output impedance due to the current buffer 624B, and may have an impedance value that is much greater than an output impedance $Z_{OUT}$ of the first amplification unit 610B. Accordingly, the second amplification unit 620B may include a plurality of amplification circuits (not shown), and even when one amplification circuit (for example, an amplification circuit including the amplifier 622B and the current buffer 624B) is enabled or disabled. The input impedance $Z_{IN2}$ to the second amplification unit 620B is very large, and thus, there is a variation in the amount of the electric current flowing in other amplification circuits. Thus, each of the amplification circuits included in the second amplification unit 620B may have an amplification gain of a constant value, thereby improving the linearity of the LNA 600B.

Referring to FIG. 12C, a second amplification unit 620C may further include a current steering circuit 626C as compared with the LNA 600A of FIG. 12A. The current steering circuit 626C includes an $M_{B3}$ transistor, and turning-on/turning-off of the $M_{B3}$ transistor may be controlled according to the switching control signal SWCS3. In more detail, if a magnitude of the RF output signal $RF_{OUT}$ needs to be reduced, the $M_{B3}$ transistor may be turned on. That is, when the $M_{B3}$ transistor is turned on, some of the electric current flowing in the amplifier 622C flows towards the current steering circuit 626C, and accordingly, the RF output signal $RF_{OUT}$ having a magnitude may be output, wherein the magnitude is smaller than that output when the $M_{B3}$ transistor is turned off. The amplification gain of the second amplification unit 620C may be adjusted by using the current steering circuit 626C.

Figure 13:
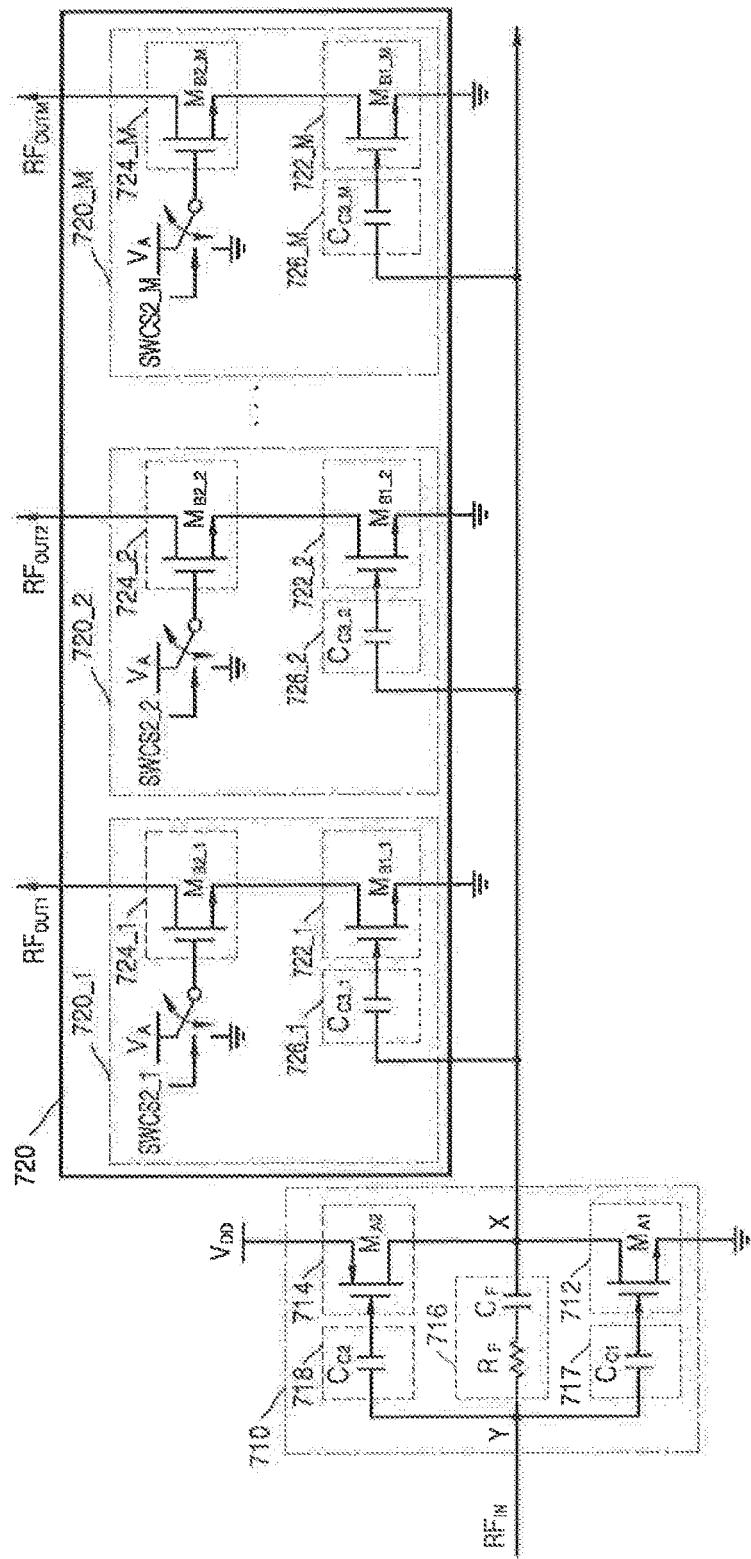
FIG. 13 is a detailed circuit diagram of a LNA according to an exemplary embodiment of the present inventive concept.
Figure 14A:
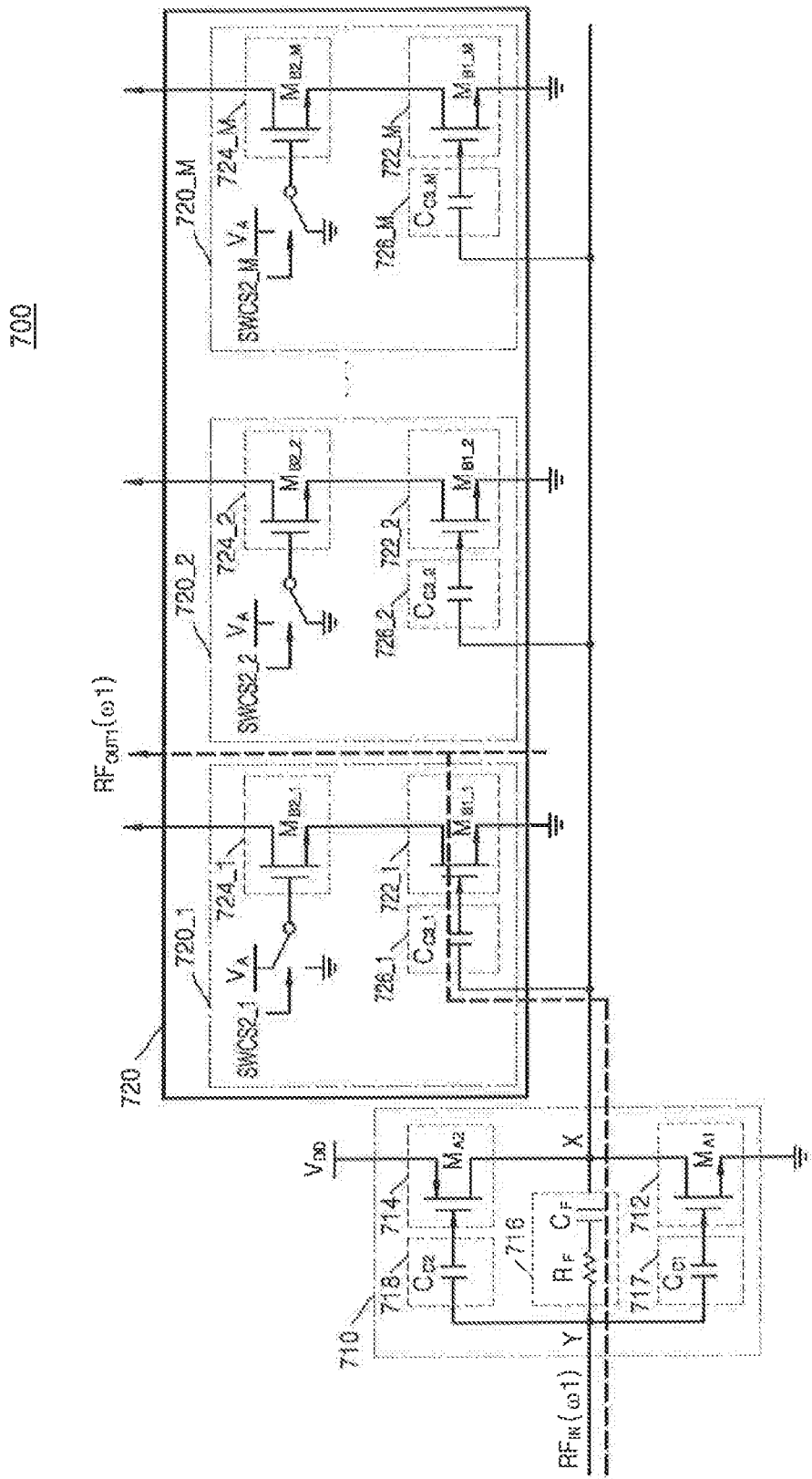
FIGS. 14A and 14B are circuit diagrams illustrating an amplifying operation of a LNA.
Figure 14B:
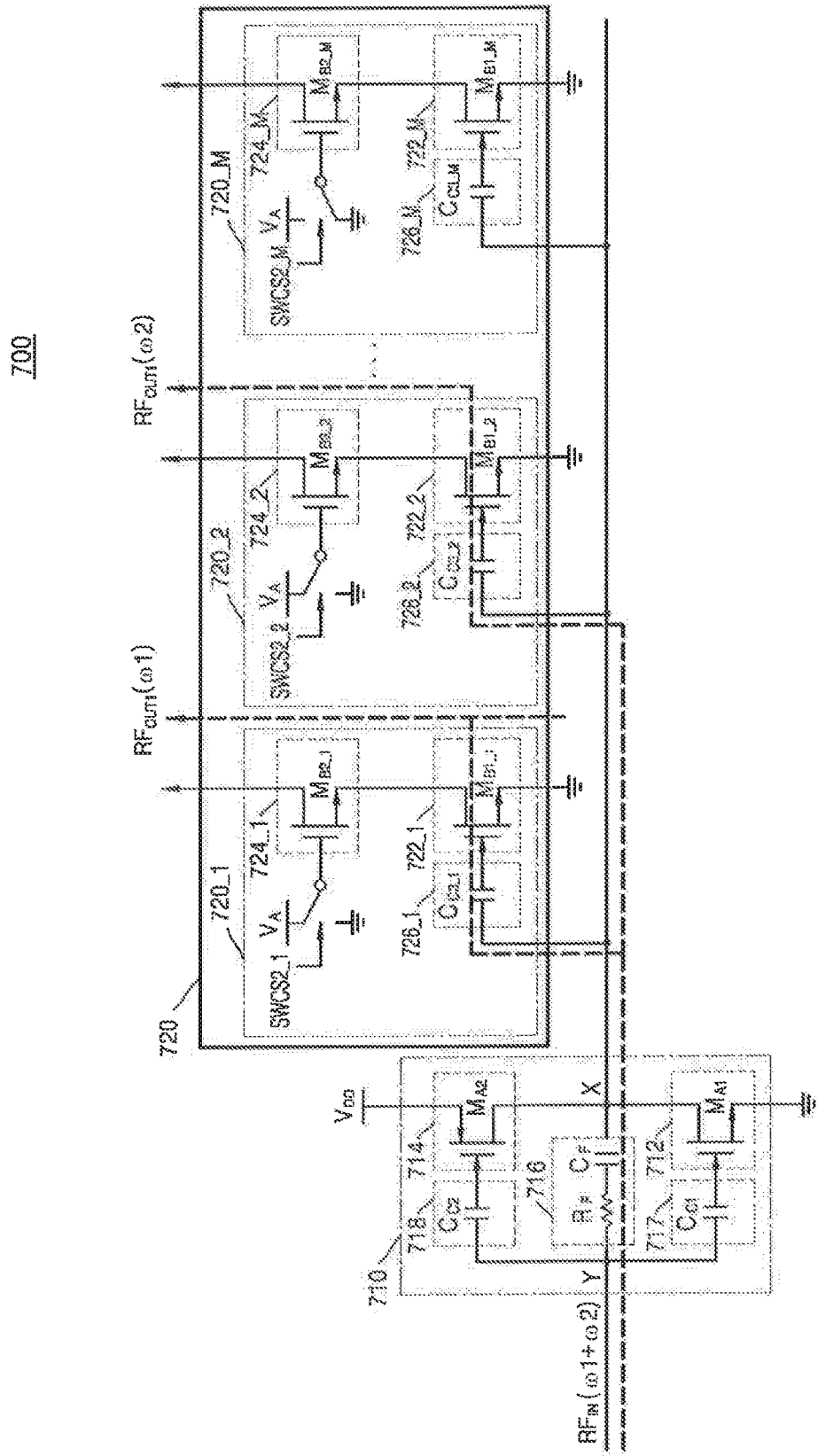

FIG. 13 is a detailed circuit diagram of an LNA 700 according to an exemplary embodiment of the present inventive concept, and FIGS. 14A and 14B are circuit diagrams illustrating amplification operations of the LNA 700.

Referring to FIG. 13, the LNA 700 includes a first amplification unit 710 and a second amplification unit 720. The first amplification unit 710 includes a first input amplifier 712, a second input amplifier 714, a feedback circuit 716, and interconnection circuits 717 and 718. The structure of the first amplification unit 710 is the same as the above description with reference to FIG. 12A, and detailed descriptions thereof are omitted.

The second amplification unit 720 includes a plurality of amplification circuits 710_1, 710_2, . . . , 720_M. The amplification circuits 710_1 to 720_M may respectively include amplifiers 722_1, 722_2, . . . , 722_M, current buffers 724_1, 724_2, . . . , 724_M, and interconnection circuits 726_1, 726_2, . . . , 726_M. The first amplifier 722_1 may include a transistor $M_{B1\_1}$, the second amplifier 722_2 may include a transistor $M_{B1\_2}$, and the m-th amplifier 722_M may include a transistor $M_{B1\_M}$. The first current buffer 724_1 may include a transistor $M_{B2\_1}$, the second current buffer 724_2 may include a transistor $M_{B2\_2}$, and the m-th current buffer 724_M may include a transistor $M_{B2\_M}$. The first interconnection circuit 726_1 may include a capacitor $C_{C3\_1}$, the second interconnection circuit 726_2 may include a capacitor $C_{C3\_2}$, and the m-th interconnection circuit 726_m may include a capacitor $C_{C3\_M}$. Although not shown in FIG. 13, each of the amplification circuits 710_1 to 720_M may further include the current steering circuit 626C of FIG. 12C. Enabling and disabling of the amplification circuits 710_1 to 720_M of the second amplification unit 720 may be controlled according to the switching control signals SWCS_1, SWCS_2, . . . , SWCS_M, and the enabled amplification circuits 710_1 to 720_M may receive the amplified RF input signal from the first amplification unit 710 and amplify the amplified RF input signal to output RF output signals RFOUT1 to RFOUTM.

FIG. 14A is a diagram illustrating amplification operations of the LNA 700 in the non-CA or the inter-band CA. Referring to FIG. 14A, the first amplification unit 710 receives the RF input signal RFIN through the first carrier ω1 in a predetermined frequency band. As described above, the first amplification unit 710 may amplify the RF input signal $RF_{IN}$, and offset the non-linear factors generated during the amplification. In an embodiment, only a first amplification circuit 720_1 from among the amplification circuits 710_1 to 720_M of the second amplification unit 720 is enabled by the switching control signal SWCS_1, and the other amplification circuits 710_2 to 720_M are disabled by the switching control signals SWCS_2 to SWCS_M. The first amplification circuit 720_1 receives the amplified RF input signal from the first amplification unit 710, amplifies the amplified RF input signal, and offsets the non-linear factors generated during the amplification and non-linear factors previously existing. The first amplification circuit 720_1 may output a first RF output signal $RF_{OUT1}$ corresponding to the first carrier ω1.

FIG. 14B is a diagram illustrating an amplification operation of the LNA 700 in the intra-band CA. Referring to FIG. 14B, the first amplification unit 710 receives the RF input signal $RF_{IN}$ transmitted through the first carrier ω1 and the second carrier ω2 within a predetermined frequency band. As described above, the first amplification unit 710 may amplify the RF input signal $RF_{IN}$, and offset the non-linear factors generated during the amplification. In an embodiment, only the first amplification circuit 720_1 and a second amplification circuit 720_2 from among the amplification circuits 710_1 to 720_M of the second amplification unit 720 are enabled by the switching control signals SWCS_1 and SWCS_2, and the other amplification circuits 720_M are disabled by the switching control signals SWCS_M. The first amplification circuit 720_1 and the second amplification circuit 720_2 receive the amplified RF input signal from the first amplification unit 710, amplifies the amplified RF input signal, and offset non-linear factors generated during the amplification and the non-linear factors existing previously. The first amplification circuit 720_1 outputs a first RF output signal $RF_{OUT1}$ corresponding to the first carrier ω1, and the second amplification circuit 720_2 outputs a second RF output signal $RF_{OUT2}$ corresponding to the second carrier ω2.

Figure 15:
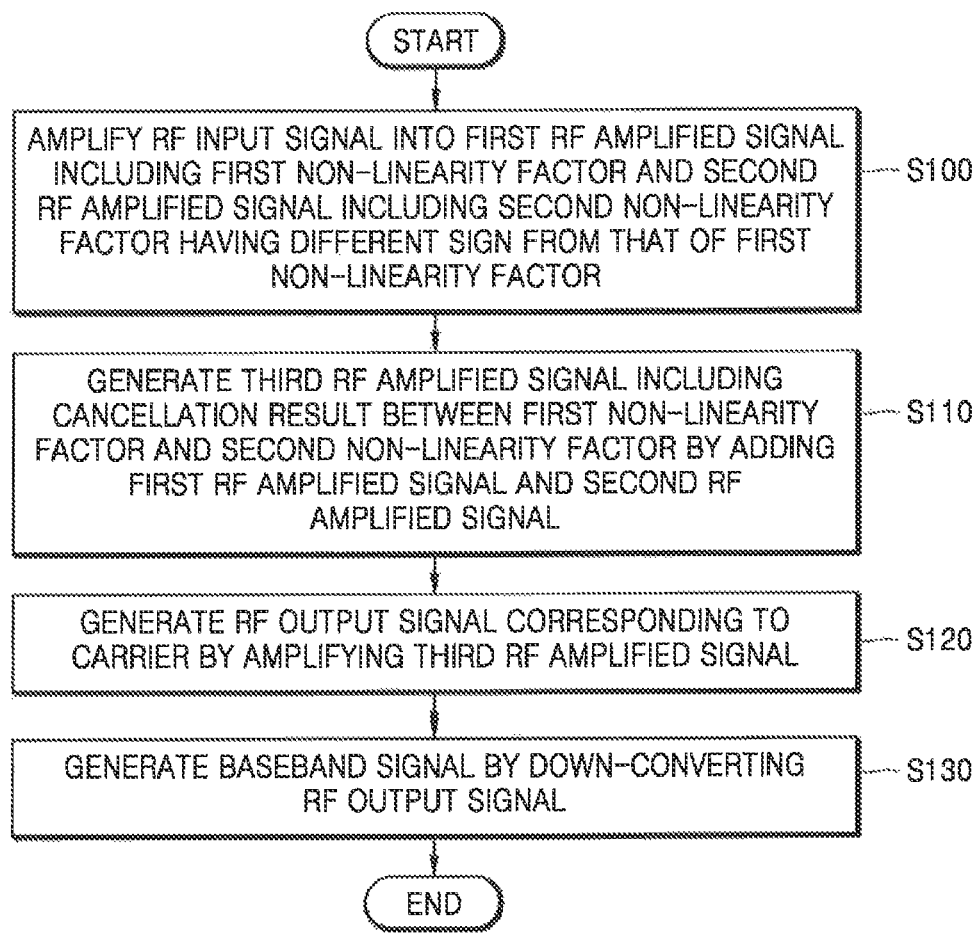
FIG. 15 is a flowchart illustrating operations of a wireless communication device according to an exemplary embodiment of the present inventive concept.

FIG. 15 is a flowchart illustrating operations of a wireless communication device according to an exemplary embodiment of the present inventive concept.

Referring to FIG. 15, the first amplification unit included in the amplifier block of the wireless communication device receives the RF input signal, and amplifies the RF input signal into a first RF amplified signal including a first non-linearity factor and a second RF amplified signal including a second non-linearity factor having a sign that is different from that of the first non-linearity factor (S100). The first amplification unit generates a third RF amplified signal including a result of offsetting the first non-linearity factor and the second non-linearity factor by each other (or a third non-linearity factor) by combining the first RF amplified signal and the second RF amplified signal (S110). The second amplification unit included in the amplifier block receives the third RF amplified signal from the first amplifier, and amplifies the third RF amplified signal to generate an RF output signal corresponding to a predetermined carrier (S120). The output circuit included in the wireless communication device receives the RF output signal from the second amplification unit, and down-converts the RF output signal to generate a baseband signal (S130).

Figure 16:
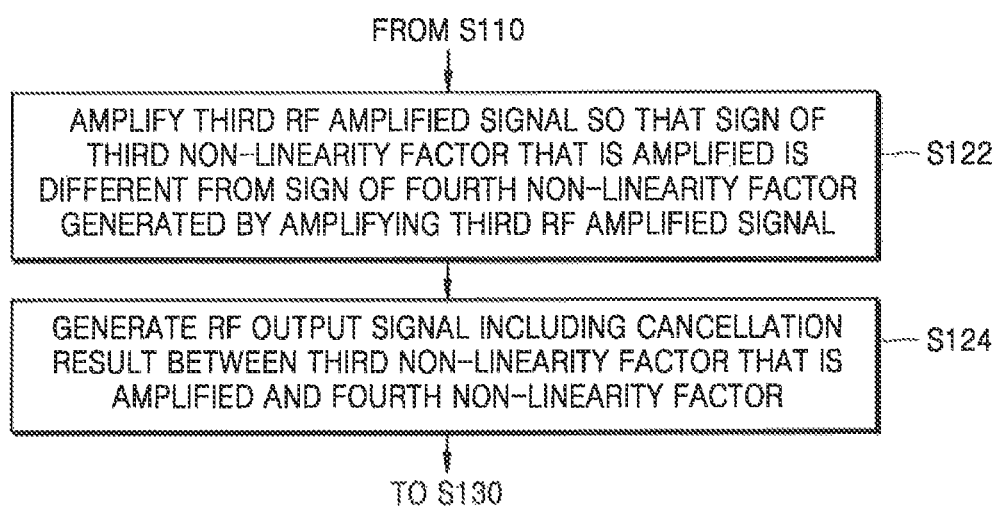
FIG. 16 is a flowchart illustrating operation S120 of FIG. 15 according to an exemplary embodiment of the inventive concept.

FIG. 16 is a flowchart illustrating operation S120 of FIG. 15 according to an exemplary embodiment of the inventive concept.

Referring to FIG. 16, after operation S110, the second amplification unit amplifies the third RF amplified signal so that a sign of the amplified third non-linearity factor is different from that of a fourth non-linearity factor that is generated when the third RF amplified signal is amplified (S122). The second amplification unit generates an RF output signal including a result of offsetting of the amplified third non-linearity factor and the fourth non-linearity factor (S124). After that, operation S130 may be performed.

While the inventive concept has been particularly shown and described with reference to embodiments thereof, it will be understood that various changes in form and details may be made therein without departing from the spirit and scope of the disclosure.

What is claimed is:

1. A wireless communication device comprising:
   an amplifier block configured to receive a radio frequency (RF) input signal transmitted using at least one carrier and amplify the RF input signal to generate at least one RF output signal, wherein the amplifier block comprises:
   a first amplifier circuit configured to amplify the RF input signal to generate a first RF amplified signal including a first non-linearity factor and a second RF amplified signal including a second non-linearity factor different from the first non-linearity factor, and combine the first RF amplified signal and the second RF amplified signal to generate a third RF amplified signal; and
   a second amplifier circuit configured to receive the third RF amplified signal and amplify the third RF amplified signal to generate an RF output signal corresponding to the at least one carrier,
   wherein the third RF amplified signal comprises a third non-linearity factor, and the second amplifier circuit generates a fourth non-linearity factor that is different from the third non-linearity factor when amplifying the third RF amplified signal.

2. The wireless communication device of claim 1, wherein a sign of the first non-linearity factor and a sign of the second non-linearity factor are opposite to each other, and wherein the combine is performed by adding the first RF amplified signal and the second RF amplified signal.

3. The wireless communication device of claim 2, wherein an absolute value of the first non-linearity factor and an absolute value of the second non-linearity factor are equal to each other.

4. The wireless communication device of claim 1, wherein the first amplifier circuit comprises:
   a first input amplifier configured to receive and amplify the RF input signal to output the first RF amplified signal; and
   a second input amplifier connected to the first input amplifier in parallel, and configured to receive and amplify the RF input signal to output the second RF amplified signal.

5. The wireless communication device of claim 4, wherein an output node of the first input amplifier is connected to an output node of the second input amplifier.

6. The wireless communication device of claim 4, wherein the first input amplifier includes a first transistor of a first width having a gate, to which the RF input signal is applied, the second input amplifier includes a second transistor of a second width having a gate, to which the RF input signal is applied, wherein the second width is different from the first width, and an operation region of the first transistor is different from an operation region of the second transistor.

7. The wireless communication device of claim 6, wherein the first transistor is configured to amplify the RF input signal into the first RF amplified signal including the first non-linearity factor having a first sign, and the second transistor is configured to amplify the RF input signal to the second RF amplified signal including the second non-linearity factor having a second sign that is different from the first sign.

8. The wireless communication device of claim 4, wherein the first amplifier circuit further comprises a feedback circuit that is connected to the first input amplifier and the second input amplifier in parallel, the feedback circuit comprising at least one resistor device and at least one capacitor device.

9. The wireless communication device of claim 1, wherein a sign of the fourth non-linearity factor is the opposite of a sign of the amplified third non-linearity factor, and wherein a final non-linearity factor of the output RF signal is a result of adding the fourth non-linearity factor and the amplified third non-linearity factor.

10. The wireless communication device of claim 9, wherein an absolute value of the fourth non-linearity factor is equal to an absolute value of the amplified third non-linearity factor.

11. The wireless communication device of claim 1, wherein the second amplifier circuit comprises a transistor having a gate, to which the third RF amplified signal is applied, and the transistor has a width so that a sign of the fourth non-linearity factor is opposite to a sign of the amplified third non-linearity factor.

12. The wireless communication device of claim 11, wherein the second amplifier circuit further comprises a current buffer connected to the transistor in series, and the current buffer is configured to be turned on or turned off based on a switching control signal transmitted from an outside source to enable or disable the first amplifier circuit.

13. The wireless communication device of claim 1, wherein an input impedance of the second amplifier circuit is greater than an output impedance of the first amplifier circuit.

14. The wireless communication device of claim 1, further comprising an output circuit for outputting the RF output signal after down-converting the RF output signal into a baseband signal.

15. The wireless communication device of claim 1, further comprising:
   at least one antenna configured to receive RF data;
   an antenna interface circuit configured to filter the RF data according to a predetermined frequency bandwidth; and
   an input matching circuit configured to perform impedance matching between the at least one antenna and the amplifier block, and generate the RF input signal by using the RF data filtered by the antenna interface circuit.

16. A receiver for receiving and processing an RF input signal based on a carrier aggregation (CA) mode, the receiver comprising:
   a plurality of amplifier blocks, wherein each of the plurality of amplifier blocks comprises:
   a first amplifier circuit comprising at least two input amplifiers having different properties from each other so that non-linearity factors generated when amplifying the RF input signal have different signs from each other, the first amplifier circuit being configured to perform a first cancellation of the non-linearity factors and amplify the RF input signal into an RF amplified signal by using the at least two input amplifiers; and
   a second amplifier circuit comprising a plurality of amplification circuits each including at least one amplifier configured to receive and amplify the RF amplified signal to output an RF output signal corresponding to a predetermined carrier.

17. The receiver of claim 16, wherein the RF amplified signal comprises a non-linearity factor, and the at least one amplifier has a predetermined characteristic so that a non-linearity factor generated when the RF amplified signal is amplified and an amplified non-linearity factor of the RF amplified signal have different signs from each other.

18. The receiver of claim 17, wherein the plurality of amplification circuits are configured to perform a second cancellation between the non-linearity factor generated when the RF amplified signal is amplified and the amplified non-linearity factor of the RF amplified signal, by using the at least one amplifier.

19. The receiver of claim 17, wherein the amplifier comprises a transistor having a gate, to which the RF amplified signal is applied, and the transistor has a predetermined width to generate a non-linearity factor having a sign that is different from a sign of the amplified non-linearity factor of the RF amplified signal, when the RF amplified signal is amplified.

20. The receiver of claim 16, wherein each of the at least two input amplifiers comprises a transistor having a gate, to which the RF input signal is applied, and the transistors have different widths from each other so that operation regions of the transistors are different from each other.

21. The receiver of claim 16, wherein, when the receiver is in an intra mode and receives an RF signal transmitted by using a first carrier and a second carrier in a first frequency band, a first amplifier block is enabled from among the plurality of amplifier blocks to receive a first RF input signal included in the RF signal, the first amplifier circuit of the first amplifier block is further configured to amplify the first RF input signal to output a first RF amplified signal to the second amplifier circuit, and a first amplifier and a second amplifier are enabled from among a plurality of amplifiers included in the second amplifier circuit of the first amplifier block, the first amplifier circuit being configured to receive and amplify the first RF amplified signal to output a first RF output signal corresponding to the first carrier, and the second amplifier circuit being configured to receive and amplify the first RF amplified signal to output a second RF output signal corresponding to the second carrier.

22. A wireless communication device comprising:
a first amplifier comprising a first complimentary transistor having a first width, the first amplifier configured to amplify an input radio frequency (RF) signal transmitted using at least one carrier to generate a first amplified RF signal;
a second amplifier comprising a non-complimentary transistor having a second width different from the first width, the second amplifier configured to amplify the input RF signal to generate a second amplified RF signal; and
a third amplifier comprising a second complimentary transistor configured to receive the first amplified RF signal and the second amplified RF signal and output a third RF amplified signal.

23. The wireless communication device of claim 22, wherein the first width and second width are set so that a sign of a first non-linearity factor of the first amplified RF signal is opposite that of a second non-linearity factor of the second amplified RF signal.

24. The wireless communication device of claim 23, wherein a width of the second complimentary transistor is set so that a sign of a third non-linearity factor of a sum of the first amplified RF signal and the second amplified RF signal is opposite that of a fourth non-linearity factor of the third RF amplified signal.

* * * * *